(12) United States Patent
Chinga et al.

(10) Patent No.: US 9,774,239 B2
(45) Date of Patent: Sep. 26, 2017

(54) METHOD AND APPARATUS FOR PROVIDING POWER

(71) Applicant: UNIVERSITY OF FLORIDA RESEARCH FOUNDATION, INC., Gainesville, FL (US)

(72) Inventors: Raul Andres Chinga, Gainesville, FL (US); Karl R. Zawoy, High Springs, FL (US); Subrata Roy, Gainesville, FL (US); Jenshan Lin, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 467 days.

(21) Appl. No.: 14/368,217

(22) PCT Filed: Dec. 24, 2012

(86) PCT No.: PCT/US2012/071570
§ 371 (c)(1),
(2) Date: Jun. 23, 2014

(87) PCT Pub. No.: WO2013/096956
PCT Pub. Date: Jun. 27, 2013

(65) Prior Publication Data
US 2014/0346875 A1 Nov. 27, 2014

Related U.S. Application Data

(60) Provisional application No. 61/580,083, filed on Dec. 23, 2011.

(51) Int. Cl.
*H02J 1/04* (2006.01)
*H02M 1/08* (2006.01)
(Continued)

(52) U.S. Cl.
CPC ......... *H02M 1/08* (2013.01); *H01J 37/32348* (2013.01); *H02M 7/44* (2013.01);
(Continued)

(58) Field of Classification Search
CPC ...... H02M 1/08; H02M 7/44; H02M 7/53803; H01J 37/32348; H05H 1/46
See application file for complete search history.

(56) References Cited

U.S. PATENT DOCUMENTS 5,815,047 A 9/1998 Sorensen et al.
7,315,160 B2 1/2008 Fosler
(Continued)

OTHER PUBLICATIONS

Alonso, J.M., et al., "Low-Power High-Voltage High-Frequency Power Supply for Ozone Generation," *IEEE Transactions on Industry Applications*, Mar./Apr. 2005, vol. 40, No. 2, pp. 414-421.
(Continued)

*Primary Examiner* — Daniel Cavallari

(57) ABSTRACT

Embodiments of the subject invention are drawn to power supply units and systems for supplying power to loads. Specific embodiments relate to systems incorporating the loads. The power supply units and systems can include a feedback mechanism for monitoring the system and maintaining a parameter of interest at or near a desired value (e.g., for maintaining the frequency of operation at or near resonance). The feedback mechanism is configured such that, if the at least one parameter indicates that the frequency of operation is away from a resonant frequency of the power amplifier, the feedback mechanism adjusts the frequency of operation closer to the resonant frequency of the power amplifier. The at least one load can have a variable impedance, though embodiments are not limited thereto.

28 Claims, 17 Drawing Sheets

(51) Int. Cl.
- *H05H 1/46* (2006.01)
- *H02M 7/538* (2007.01)
- *H01J 37/32* (2006.01)
- *H02M 7/44* (2006.01)
- *H02M 7/48* (2007.01)
- *H02M 1/00* (2006.01)

(52) U.S. Cl.
CPC .......... *H02M 7/53803* (2013.01); *H05H 1/46* (2013.01); *H02M 2001/0003* (2013.01); *H02M 2007/4815* (2013.01); *H05H 2001/4682* (2013.01); *Y02B 70/1441* (2013.01); *Y10T 307/406* (2015.04)

(56) References Cited

U.S. PATENT DOCUMENTS

| | | |
|---|---|---|
| 2005/0017695 A1 | 1/2005 | Stanley |
| 2008/0079392 A1* | 4/2008 | Baarman ............... H02J 7/0072 320/108 |
| 2008/0094001 A1 | 4/2008 | Yoo et al. |
| 2008/0297134 A1 | 12/2008 | Lee |

OTHER PUBLICATIONS

Ben-Yaakov, S., et al., "A Self-Adjusting Sinusoidal Power Source Suitable for Driving Capacitive Loads," *IEEE Transactions on Power Electronics*, Jul. 2006, vol. 21, No. 4, pp. 890-898.

Berg, D., et al., "Active Load Control Techniques for Wind Turbines," Sandia National Laboratories, Report No. SAND2008-4809, Jul. 2008.

Kriegseis, J., et al., "Power consumption, discharge capacitance and light emission as measures for thrust production of dielectric barrier discharge plasma actuators," *Journal of Applied Physics*, 2011, vol. 110, Article No. 013305.

Utkin, Y.G., et al., "Development and use of localized arc filament plasma actuators for high-speed flow control," *Journal of Physics D: Applied Physics*, 2007, vol. 40m pp. 685-694.

* cited by examiner

| Power Amplifier | | | | | | | | Electrode Location (m,n) | | | | | | | | | | | | | |
|---|---|---|---|---|---|---|---|---|---|---|---|---|---|---|---|---|---|---|---|---|---|
| 1 | 2 | 3 | 4 | 5 | 6 | 7 | 8 | (1,1) | (1,2) | (1,3) | (2,1) | (2,2) | (2,3) | (3,1) | (3,2) | (3,3) | (4,1) | (4,2) | (4,3) | (5,1) | (5,2) | (5,3) |
| 1 | 0 | 0 | 0 | 0 | 1 | 0 | 0 | 1 | 0 | 0 | 0 | 0 | 0 | 0 | 0 | 0 | 0 | 0 | 0 | 0 | 0 | 0 |
| 1 | 0 | 0 | 0 | 0 | 0 | 1 | 0 | 0 | 1 | 0 | 0 | 0 | 0 | 0 | 0 | 0 | 0 | 0 | 0 | 0 | 0 | 0 |
| 1 | 0 | 0 | 0 | 0 | 0 | 0 | 1 | 0 | 0 | 1 | 0 | 0 | 0 | 0 | 0 | 0 | 0 | 0 | 0 | 0 | 0 | 0 |
| 0 | 1 | 0 | 0 | 0 | 1 | 0 | 0 | 0 | 0 | 0 | 1 | 0 | 0 | 0 | 0 | 0 | 0 | 0 | 0 | 0 | 0 | 0 |
| 0 | 1 | 0 | 0 | 0 | 0 | 1 | 0 | 0 | 0 | 0 | 0 | 1 | 0 | 0 | 0 | 0 | 0 | 0 | 0 | 0 | 0 | 0 |
| 0 | 1 | 0 | 0 | 0 | 0 | 0 | 1 | 0 | 0 | 0 | 0 | 0 | 1 | 0 | 0 | 0 | 0 | 0 | 0 | 0 | 0 | 0 |
| 0 | 0 | 1 | 0 | 0 | 1 | 0 | 0 | 0 | 0 | 0 | 0 | 0 | 0 | 1 | 0 | 0 | 0 | 0 | 0 | 0 | 0 | 0 |
| 0 | 0 | 1 | 0 | 0 | 0 | 1 | 0 | 0 | 0 | 0 | 0 | 0 | 0 | 0 | 1 | 0 | 0 | 0 | 0 | 0 | 0 | 0 |
| 0 | 0 | 1 | 0 | 0 | 0 | 0 | 1 | 0 | 0 | 0 | 0 | 0 | 0 | 0 | 0 | 1 | 0 | 0 | 0 | 0 | 0 | 0 |
| 0 | 0 | 0 | 1 | 0 | 1 | 0 | 0 | 0 | 0 | 0 | 0 | 0 | 0 | 0 | 0 | 0 | 1 | 0 | 0 | 0 | 0 | 0 |
| 0 | 0 | 0 | 1 | 0 | 0 | 1 | 0 | 0 | 0 | 0 | 0 | 0 | 0 | 0 | 0 | 0 | 0 | 1 | 0 | 0 | 0 | 0 |
| 0 | 0 | 0 | 1 | 0 | 0 | 0 | 1 | 0 | 0 | 0 | 0 | 0 | 0 | 0 | 0 | 0 | 0 | 0 | 1 | 0 | 0 | 0 |
| 0 | 0 | 0 | 0 | 1 | 1 | 0 | 0 | 0 | 0 | 0 | 0 | 0 | 0 | 0 | 0 | 0 | 0 | 0 | 0 | 1 | 0 | 0 |
| 0 | 0 | 0 | 0 | 1 | 0 | 1 | 0 | 0 | 0 | 0 | 0 | 0 | 0 | 0 | 0 | 0 | 0 | 0 | 0 | 0 | 1 | 0 |
| 0 | 0 | 0 | 0 | 1 | 0 | 0 | 1 | 0 | 0 | 0 | 0 | 0 | 0 | 0 | 0 | 0 | 0 | 0 | 0 | 0 | 0 | 1 |

FIG. 23

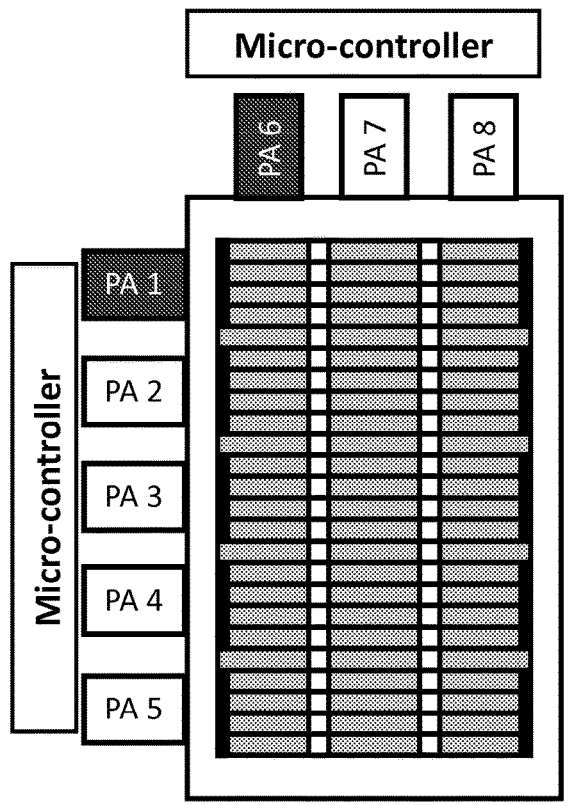
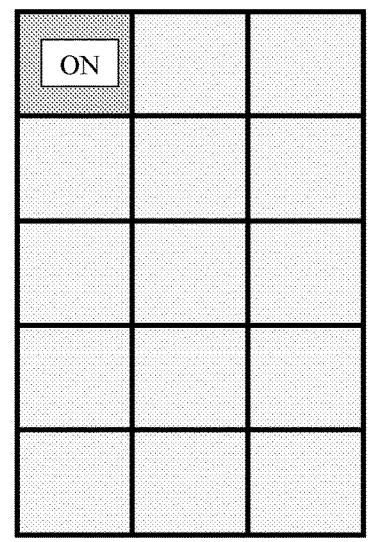
FIG. 24A                    FIG.24B

METHOD AND APPARATUS FOR PROVIDING POWER

CROSS-REFERENCE TO RELATED APPLICATIONS

The present application is the U.S. National Stage Application of International Patent Application No. PCT/2012/071570, filed Dec. 24, 2012, which claims the benefit of U.S. Provisional Application Ser. No. 61/580,083, filed Dec. 23, 2011, both of which are hereby incorporated by reference in their entirety, including any figures, tables, or drawings.

BACKGROUND OF INVENTION

Solid state flow control devices are in high demand for moderate to high flow speeds. Such devices can have several important applications. Current solid state flow control devices operate using arc filament and/or arc heating flow control methods. These methods require a high amount of energy and lead to high manufacturing costs.

The generation of plasma due to electrical input has important applications. The basic mechanisms inherent in non-equilibrium discharges such as obtained through DC, RF, or microwave excitation have also been utilized for ionization purposes, so as to increase the conductivity of air for further control with ponderomotive forces generated with an imposed magnetic field. Dielectric barrier discharge (DBD) involves one dielectric coated electrode that is typically exposed at the surface to the surrounding atmosphere, while another electrode is embedded inside a layer of insulator. The emission of UV light as well as chemical processes in surface plasmas is suitable for decontamination in a short timescale and using very low power and heat.

Dielectric barrier plasma discharge at atmospheric pressure (APDBD) has the potential to become a new practical and effective method of sterilization. Sterilization technology has broad applications, from medical devices to food preparation equipment. Products that could self-sterilize after being used could save lives by diminishing accidental exposure of users to infectious diseases and contaminated materials. Conventional sterilization methods, such as autoclaving, use high pressure and temperature to attempt to kill bacteria. Autoclaving is widely used in hospital settings and can be effective. However, it requires long sterilization times (~20-40 min), longer standing times, and a large infrastructure. Among other techniques used are dry heat ovens, use of chemical agents, gamma ray irradiation, and UV sterilization. Each of these requires expensive infrastructure and long periods of time to achieve complete sterilization.

When plasma is generated, there are radicals that are formed. These can include ozone, heat, and UV light. The combination of these radicals makes possible the process of sterilization via plasma generation. Traditionally, in plasma discharge, a DC voltage potential is placed across two electrodes. If the voltage potential is gradually increased, at the breakdown voltage $V_B$, the current and the amount of excitation of the neutral gas becomes large enough to produce a visible plasma. According to Paschen's law, the breakdown voltage for a particular gas depends on the product (p×d) of the gas pressure and the distance between the electrodes. For any gas there is unique p×d value referred to as the Stoletow point where volumetric ionization is the maximum. The Stoletow point for air requires a minimum $V_B$=360 V and p×d=5.7 Torr-mm.

Near atmospheric pressure, the allowable electrode spacing necessary for maximum volumetric ionization is d=7.7 µm. In some applications, for example in high-speed air vehicles, this is an impractical limitation. A solution to this limitation comes from the recent development of RF glow discharge using an AC voltage potential across the electrodes. The frequency of the current must be such that within a period of the a.c. cycle, electrons must travel to the electrodes and generate a charge, while the heavier ions cannot. Based on reported experiments [2] in air or other gases at 760±25 torr, a homogeneous glow can be maintained at 3 to 20 kHz RF and rms electrode voltage between 2 to 15 kV. A critical criterion for such discharge in air is to meet the electric field requirement of about 30 kV/cm. While the voltage is high, only a few milliamps current is required to sustain a RF driven barrier discharge.

Power supply units that drive dielectric barrier discharge devices like plasma actuators and plasma sterilization devices are heavy and bulky weighing several kilograms occupying several square feet of footprint.

A power amplifier commonly used in single-load applications is a full bridge rectifier. The design consists of a transformer being used at resonance with the load. However, it consists of 4 transistors and large passive components, making it bulky. This system can be used for single-load applications.

Ben-Yaakov and Peretz disclosed a power supply system using a feedback mechanism to achieve stability and a self-tuned resonant system (Ben-Yaakov and Peretz, A Self-Adjusting Sinusoidal Power Source Suitable for Driving Capacitive Loads, IEEE Transactions on Power Electronics, Vol. 21, No. 4, July 2006). Also, Alonso et al. disclosed a power supply for ozone generation (Alonso et al., Low-Power High-Voltage High-Frequency Power Supply for Ozone Generation, IEEE Transactions on Industry Applications, Vol. 40, No. 2, March/April 2004). However, these designs are not efficient and do not produce power outputs high enough for plasma generation.

BRIEF SUMMARY

Embodiments of the subject invention are drawn to power supply units and systems for supplying power to loads. Specific embodiments relate to systems incorporating the loads. The power supply units and systems can include a feedback mechanism for monitoring the system and maintaining a parameter of interest at or near a desired value (e.g., for maintaining the frequency of operation at or near resonance).

In an embodiment, a power supply unit, can include at least one power amplifier having a first inductor, a transformer, and a feedback mechanism. The feedback mechanism can be configured to monitor at least one parameter of the power amplifier corresponding to a frequency of operation of the power amplifier. Also, the feedback mechanism can be configured such that, if the at least one parameter indicates that the frequency of operation is more than 5% away from a resonant frequency of the power amplifier, the feedback mechanism adjusts the frequency of operation closer to the resonant frequency of the power amplifier.

In another embodiment, a system can include a power supply unit and at least one load. The power supply unit can include at least one power amplifier having a first inductor and a transformer, and a feedback mechanism. The feedback mechanism can be configured to monitor at least one parameter of the power amplifier corresponding to a frequency of operation of the power amplifier. The feedback mechanism is configured such that, if the at least one parameter indicates that the frequency of operation is away from a resonant frequency of the power amplifier, the feedback mechanism adjusts the frequency of operation closer to the resonant frequency of the power amplifier. The at least one load can have a variable impedance, though embodiments are not limited thereto.

FIGS. 20A and 20B shows the electrode design for a larger surface. It consists of columns and rows as bottom and top electrodes, respectively. This design allows the system to generate plasma on a single "cell" (area of 1" by 1") at a time, and sweep it across until the complete surface has been covered. FIG. 20A shows a large electrode array having m rows by n columns (top and bottom electrodes) and FIG. 20B shows how the plasma can be generated from right to left, one row at a time, in accordance with a specific embodiment. It starts at cell (1,1) and ends at cell (m,n), where m is the number of rows and n the number of columns. The peed of sweeping is made such that it looks as if the complete surface is on to the naked eye. This technique is comparable to the way a computer screen operates.

To generate the require voltage, two power amplifiers, such as power amplifiers discussed herein, are used with a 180 degree offset on each other. By applying each corresponding voltage to the top and bottom electrode, their difference results in a voltage of twice the amplitude of each power amplifier. Since the output voltage required by the power amplifier is reduced by half, the stress on the components are lower, which can improve reliability. In addition, components become less expensive and smaller.

FIG. 21 shows how the applied voltages on the top and bottom electrodes, being offset by 180°, can result in a voltage of twice the amplitude of the applied voltages.

The total number of power amplifiers used in an embodiment of the system is m+n, as shown in FIG. 22. The system selects each cells by controlling the power amplifiers with the use of a micro-controller.

FIG. 23 shows the logic truth table that is used to select a cell. FIG. 23 also shows that only two power amplifiers need to operate at once. In a specific embodiment, the m+n power amplifiers can be replaced by only two power amplifiers, or a number of power amplifiers between 2 and m+n. High voltage mechanical relays can be employed to connect the top and bottom electrodes to the two or more power amplifiers, in an embodiment having fewer than m+N power amplifiers. However, the relays may not fully turn off a cell. In an embodiment, each cell has a capacitance of approximately 8 pF while each relay has between 2 and 3 pF (depending on brand). As these impedances are comparable, a relay will likely not fully switch off a cell, making the use of mechanical relays less desirable for this application. Further, mechanical relays may be less reliable as well. In addition, by using m+n power amplifiers, the time spent driving the work is distributed among all the Pas and will not be running during the whole sterilization time. This increases reliability given each PA operates for less time.

In an embodiment, when plasma is generated across a single cell, the adjacent cells do present some voltage across them. This can occur because the electrodes being powered cover a complete row and column as shown in FIG. 24A. However, this voltage or adjacent cells decays along the row (or column) and does not generate plasma across the adjacent cells. Accordingly, the power consumed by the voltage across adjacent cells is not significant. FIG. 24A shows that plasma across cell (0,1) is generated by enabling power amplifier 1 and power amplifier 6, while FIG. 24B shows the voltage across adjacent cells decays to a low value that is not high enough to produce plasma, such that power loss across adjacent cells is not significant. To further reduce the voltage across the adjacent cells, the material used as the substrate can have electrical properties that increase the decaying of the electric field more rapidly.

In a specific embodiment, the size of each cell is approximately 1" by 1". In additional embodiments, the cells can be made much smaller (e.g., 0.1" by 0.1"), if desired. With embodiments having smaller cells for the same overall surface area, the number of power amplifiers can increase, while the power requirement per cell decreases. In this way, the power needed to generate plasma across a certain surface area is divided among more power amplifiers. Since power requirements per power amplifier decreases, components can be reduced in size. Also, using smaller cells increases the "resolution" of the surface plasma. This is the same concept as the pixels on a computer screen. The more pixels, the better the resolution. For a plasma sterilizer, the more resolution, the more efficient the system can be is at generating plasma only across the contaminated cells.

BRIEF DESCRIPTION OF DRAWINGS

FIG. 23 shows the logic truth table that is used to select a cell in a specific embodiment.

FIG. 24A shows that plasma across cell (0,1) is generated by enabling power amplifier 1 and power amplifier 6 in a specific embodiment.

FIG. 24B shows the voltage across adjacent cells decays to a low value that is not high enough to produce plasma in a specific embodiment.

DETAILED DISCLOSURE

Figure 1:
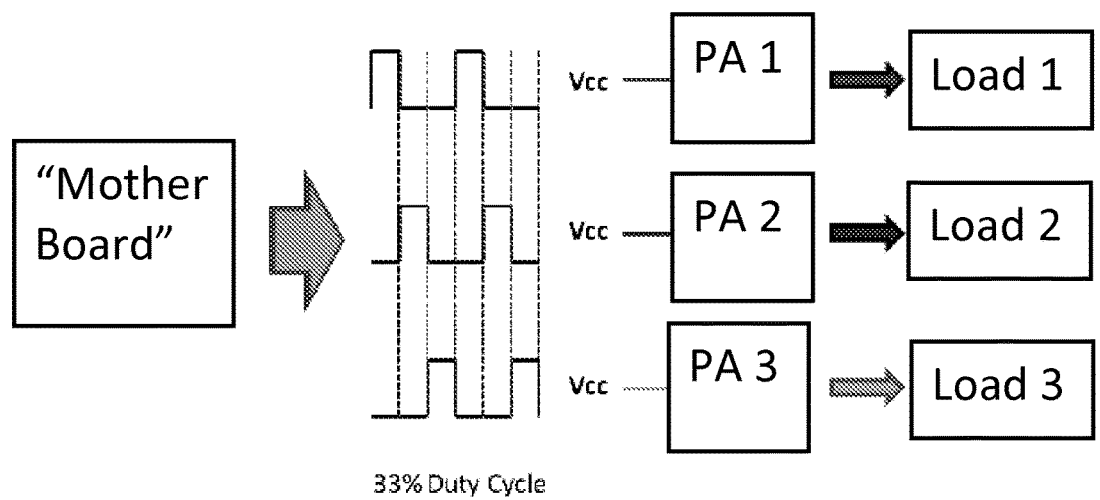
FIG. 1 shows a schematic of a power supply unit having multiple plasma actuators controlled by a motherboard, according to an embodiment of the subject invention.

When the term "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05 kg.

Embodiments of the subject invention relate to apparatuses and methods for providing power supply units. Power supply units of the subject invention can be small and/or portable and can be used for a variety of applications, including plasma generators. For example, power supply units of the subject invention can be used to drive dielectric barrier discharge (DBD) devices, such as plasma actuators and plasma sterilization devices.

In many embodiments, a power supply unit can have a footprint that is about the size of a human hand or less. For example, the footprint of the power supply unit can be less than 45 square inches (in$^2$). In further embodiments, the footprint of the power supply unit can be less than, e.g., 40 in$^2$, 35 in$^2$, 30 in$^2$, 29 in$^2$, 28 in$^2$, 27 in$^2$, 26 in$^2$, 25 in$^2$, 24 in$^2$, 23 in$^2$, 22 in$^2$, 21 in$^2$, 20 in$^2$, 19 in$^2$, 18 in$^2$, 17 in$^2$, 16 in$^2$, 15 in$^2$, 14 in$^2$, 13 in$^2$, 12 in$^2$, 11 in$^2$, 10 in$^2$, 9 in$^2$, 8 in$^2$, 7 in$^2$, 6 in$^2$, 5.25 in$^2$, 5 in$^2$, 4 in$^2$, 3.5 in$^2$, 3.4 in$^2$, 3.36 in$^2$, 3.35 in$^2$, 3 in$^2$, 2.25 in$^2$, 2 in$^2$, 1 in$^2$, or 0.5 in$^2$. In an embodiment, the power supply unit can be in the shape of a thin plate, and the face of the power supply unit can provide the footprint.

In many embodiments, a power supply unit can be very lightweight. In an embodiment, a power supply unit can have a weight of less than 100 grams (g). In further embodiments, a power supply unit can have a weight of less than, e.g., 95 g, 90 g, 85 g, 80 g, 75 g, 70 g, 65 g, 60 g, 55 g, 50 g, 45 g, 40 g, 35 g, or 30 g.

In many embodiments, a power supply unit can provide voltages in the kilovolt (kV) range. Such voltages can produce, e.g., DBD plasma. In an embodiment, a power supply unit can provide a voltage of at least 12 kV peak-to-peak (pp). In further embodiments, a power supply unit can provide a voltage of at least, e.g., 1 kVpp, 2 kVpp, 3 kVpp, 4 kVpp, 5 kVpp, 6 kVpp, 7 kVpp, 8 kVpp, 9 kVpp, 10 kVpp, 11 kVpp, 12 kVpp, 13 kVpp, 14 kVpp, 16 kVpp, 17 kVpp, 18 kVpp, 19 kVpp, 20 kVpp, 21 kVpp, 22 kVpp, 23 kVpp, 24 kVpp, 25 kVpp, 26 kVpp, 27 kVpp, 28 kVpp, 29 kVpp, or 30 kVpp.

Power supply units of the subject invention can provide power to at least one load. Each load can be, for example, an electrode, such as an electrode used for plasma generation. In an embodiment, a power supply unit can include a system which is capable of running more than one load. In an alternative embodiment, a power supply unit can include multiple systems put together and controlled by a controller. Each system can be, for example, a power amplifier such as a zero-voltage switching amplifier. The controller can be any controller known in the art capable of driving and/or switching voltage-providing systems, for example, a microcontroller or other circuit. In an embodiment, the controller can be a motherboard including a microcontroller and additional circuitry which can be provided to inhibit damage.

In an embodiment, a power supply unit can include a single power amplifier, which can be used to power on and off an array of loads.

In an alternative embodiment, a power supply unit can include at least two power amplifiers controlled by a controller. The controller can be configured to turn on and off each power amplifier. The power supply unit can also include a switch connecting each load to a power amplifier. The controller can be configured to open and close the switches connecting the loads to the power amplifiers. The power supply unit can also include a feedback mechanism, and the controller can be configured to control the feedback mechanism, which can be switched from load to load.

In many embodiments of the subject invention, a power supply unit, or system, which may incorporate the load(s), can include a feedback mechanism. The feedback mechanism can be configured to monitor the system, which can include monitoring the load(s), to determine if/when the value of a parameter of interest is outside an acceptable range and then adjust another parameter accordingly. For example, the feedback mechanism can be configured to adjust the frequency of operation based on, e.g., changes in the impedance of the load (or loads) of the power supply unit and/or changes in the voltage provided by the power supply unit. In many embodiments, the feedback mechanism can be configured to monitor (e.g., by measuring) a parameter. The feedback mechanism can be configured such that, if the measurement(s) indicate(s) that the frequency of operation is no longer at or very close (e.g., within 5%, 4%, 3%, or 2%) to the resonant frequency, the feedback mechanism adjusts the frequency of operation closer to the resonant frequency. In specific embodiments, when the measurement(s) indicate(s) that the frequency of operation is at or very close (e.g., within 5%, 4%, 3%, or 2%) to the resonant frequency, then no adjustment to the frequency of operation is made.

For example, in an embodiment, no adjustment to the frequency of operation is made if the measurement(s) indicate(s) that the frequency of operation is within 5% of the resonant frequency. In a further embodiment, no adjustment to the frequency of operation is made if the measurement(s) indicate(s) that the frequency of operation is within 4% of the resonant frequency. In yet a further embodiment, no adjustment to the frequency of operation is made if the measurement(s) indicate(s) that the frequency of operation is within 3% of the resonant frequency. In yet a further embodiment, no adjustment to the frequency of operation is made if the measurement(s) indicate(s) that the frequency of operation is within 2.27% of the resonant frequency. In yet a further embodiment, no adjustment to the frequency of operation is made if the measurement(s) indicate(s) that the frequency of operation is within 2% of the resonant frequency. In yet a further embodiment, no adjustment to the frequency of operation is made if the measurement(s) indicate(s) that the frequency of operation is within 1% of the resonant frequency. In yet a further embodiment, no adjustment to the frequency of operation is made if the measurement(s) indicate(s) that the frequency of operation is within 0.5% of the resonant frequency. In yet a further embodiment, no adjustment to the frequency of operation is made if the measurement(s) indicate(s) that the frequency of operation is within 0.1% of the resonant frequency.

In certain embodiments, the feedback mechanism can be configured such that, if the measurement(s) indicate(s) that the frequency of operation is no longer at or very close (e.g., within 5%, 4%, 3%, or 2%) to the resonant frequency, the feedback mechanism adjusts the frequency of operation closer to the resonant frequency. Then, the new value of the parameter of interest can be compared by the feedback mechanism to the previous value of the parameter of interest until a desired value is reached, e.g. a value that indicates that the frequency of operation of the power supply unit is the resonant frequency. For example, if the parameter of interest is the output voltage provided by the power supply unit, the current value of the output voltage can be compared by the feedback mechanism to the previous value until the maximum value is reached (e.g., until the value plateaus), indicating that the resonant frequency has been reached.

In an embodiment, the feedback mechanism can be configured to measure the voltage provided by the power supply unit and to adjust the frequency of operation closer to the resonant frequency if the voltage measurement indicates that the frequency of operation is no longer at or very close (e.g., within 5%, 4%, 3%, or 2%) to the resonant frequency. In another embodiment, the feedback mechanism can be configured to measure the current provided by the power supply unit and to adjust the frequency of operation closer to the resonant frequency if the current measurement indicates that the frequency of operation is no longer at or very close (e.g., within 5%, 4%, 3%, or 2%) to the resonant frequency. The current can be measured by, for example, adding a resistor in series at the output of the power supply unit. In another embodiment, the feedback mechanism can be configured to monitor the input side of the power supply unit (e.g., the input voltage and/or the input current). In a further embodiment, the feedback mechanism can be configured to monitor multiple points in the power supply unit (e.g., the voltage, current, and/or impedance at one or more points). In yet a further embodiment, the feedback mechanism can be configured to monitor the power supply unit wirelessly. For example, the feedback mechanism can be configured to wirelessly measure the electric field of the load (or the power supply unit) based on a correlation between the voltage applied to the load (or loads) and the electric field of the load (or the power supply unit).

When the resonance frequency is achieved, the voltage across a load or loads is the highest for a given input voltage, leading to high-efficiency operation. If the system is not at resonance, a higher input voltage is required, leading to higher power consumption and more stress on the transistor(s) within the power supply. Thus, the feedback mechanism of the subject invention advantageously leads to a higher efficiency power supply unit.

In many embodiments, a power supply unit can provide voltage to at least 2 loads. Each load can be, for example, an electrode, such as an electrode used for plasma generation. In further embodiments, a power supply unit can provide voltage to at least, e.g., 3 loads, 4 loads, 5 loads, 6 loads, 7 loads, 8 loads, 9 loads, 10 loads, 11 loads, 12 loads, 13 loads, 14 loads, 15 loads, 16 loads, 17 loads, 18 loads, 19 loads, or 20 loads. In a specific embodiment, a power supply unit can include four power amplifiers such that each power amplifier provides voltage to four loads.

In many embodiments, a power supply unit can include an inductor. For example, the power supply unit can include one or more power amplifiers, and each power amplifier can include an inductor.

In an embodiment of the subject invention, a system can include a power supply unit and at least one load. The power supply unit can be as described herein and can include a feedback mechanism. For example, the power supply unit can include one or more power amplifiers, and each power amplifier can include an inductor. Each load can be any reasonable load known in the art. In many embodiments, at least one load can have variable impedance. For example, at least one load can have an impedance which may vary by as much as 150-160% or more.

In an embodiment, each load of the system can be an electrode, e.g., an electrode of a pair of electrodes. For example, each load can be a self-sterilization device (SSD) wherein plasma is generated across electrodes (e.g., a pair of electrodes) of the SSD. The SSD can be used for sterilizing a liquid, a gas, a solid, or the surface of the SSD. For example, the SSD can be used to sterilize blood or a scalpel. When the SSD sterilizes a liquid, gas, or solid, the impedance of the SSD can change. For example, in a certain embodiment, when a SSD sterilizes 40 µL of blood (approximately 2 drops), the impedance of the SSD can change by about 160%. Holding a scalpel to be sterilized close to an electrode of an SSD can also result in a large change in the impedance of the SSD. In a specific embodiment, a load can be an SSD having plastic spacers on the electrodes. Such plastic spacers can inhibit contact between the electrodes and an object to be sterilized (e.g., a scalpel).

In certain embodiments of the invention, each load can be a SSD for self-sterilizing a surface or other portion of the apparatus and/or sterilizing other objects. Such a SSD can utilize self-generated and/or remotely controlled plasma fields for the purpose of self-sterilization and/or sterilization of another object. Such a SSD can have broad applications in procedures and equipment requiring the sterility of devices used for medical procedures, drug delivery, sterility of consumer products, and sterility of food preparation equipment and tools.

SSDs can incorporate electrode structures for providing sterilizing plasmas into a variety of surfaces that can be self-sterilized. Surfaces having a variety of shapes can be incorporated with embodiments of the invention. A flat laminate surface can be used with, for example, a cutting board, a surgical surface, or a scalpel and can incorporate an array of embedded electrodes for producing an appropriate plasma. An example of a surface could be a flat, flexible, self-sterilizing laminate surface, with cross-sectional views of the laminate surface. The laminate surface can have a dielectric layer positioned in between two electrode layers.

In an embodiment, a SSD can sterilize a surface separate from the device by rolling over the surface so as to provide a plasma over the surface that can roll over other surfaces. Electrodes can be incorporated into an outer cylindrical surface that can roll over other surfaces. The switch can act to push the retractable sterilizer out of the device body and retract the retractable sterilizer back into the device body. Other applications for the use of electrodes on outer cylindrical surfaces include, but are not limited to, scopes or probes, diagnostic surfaces, and laboratory testing equipment. The interlock can protect inadvertent exposure from the plasma field.

In an embodiment, electrodes of a SSD can be incorporated into an inner cylindrical surface. Other applications for the use of electrodes on inner cylindrical surfaces include, but are not limited to, drug delivery ports, beakers, flasks, and laboratory pipettes. The switch can be used to turn on and off the electrodes. In an embodiment, the electrodes can be embedded in the inner surface of the container. In a specific embodiment, a fluid can be brought in through the tubing. The tubing can allow entry of an electrical connection, blood, IV drugs, or other materials. The electrodes are shown on the container inner surface, but could extend over the lip and/or the outer surface as well. The bottom of the container can also incorporate electrodes. The container can have many cross-sectional shapes, such as rectangular.

In an embodiment, electrodes of a SSD can be incorporated into spherical, doughnut, or other curved shaped surfaces for use in, for example, implantable diagnostic probes and/or laboratory probes that need to be sterilized between tests or samples. In an embodiment, a spherical surface can roll on another surface to sterilize the other surface.

Electrodes of a SSD can be incorporated into a device such that the electrodes can be positioned to produce a plasma so as to sterilize a needle shaft and tip or scalpel. In an embodiment, electrodes can reside near the inner wall of the interior of the device with the needle or knife retracting into the interior of the device for sterilization. Alternatively, the electrodes can be designed to extend out of the interior of the device to sterilize the needle or knife and the electrodes can then retract into the interior of the device after sterilization. Such a SSD can be used with, for example, IV needles, hypodermic needles, other needles used for medical procedures, diagnostic catheters, implantable devices, and scalpels. A specific embodiment is directed to an IV Cannula that self-sterilizes before insertion into patient and after it is removed from patient to minimize contamination or accidental infection to the patient or caregiver. A SSD can be incorporated with medical devices such as a scalpel, syringe, catheter, electrode or other device that can self-sterilize during a medical procedure. For example, the scalpel can self-sterilize during use to alleviate cross-contamination between the infected and healthy part of the patients body or between patients. Typical usage is in triage or emergency situations or where there is a limited supply of medical devices or instruments. In specific embodiments, tolerances from sub-millimeter up to a millimeter between the needle or scalpel and the inner wall may be implemented.

A SSD can have a braided electrode incorporated into a tube, where a plasma can sterilize the inside surface of the tube, the outside surface of the tube, and/or an object inserted into the tube. Such a SSD can be used in, for example, balloon catheters, urinary catheters, guiding catheters, ablation devices, and implantable/stent devices. The braiding is used as a conductive pathway for generating plasma while also allowing the tube to bend without kinking. In a specific embodiment, medical devices are provided that can self-sterilize in a specific area or zone of the device to allow the continuous administration of drugs or treatments while maintaining a sterile barrier to the patient or caregiver. Other electrode structures can be utilized as well. The tube can have a plastic layer with wire electrodes braided around the inside and/or outside of the tube so as to leave spaces between the wire electrodes or otherwise prevent contact of adjacent wire electrodes. With one braid, the cross-hatching wire electrodes can be opposite electrodes. Some wire electrodes can be dielectrics to keep metal electrodes touching.

In an embodiment, a SSD can include a cloth or woven surface incorporating electrodes to clean or protect a device, patient, or any surface that needs a sterile barrier. The cloth or woven surface can be placed adjacent to surfaces and/or portions of items to be sterilized, and the plasma generated by the cloth or woven surface can sterilize such surfaces and/or portions of items. A pixel shaped electrode matrix, with appropriate addressing through a backplane, can be used. The pixel electrodes can be in the range of 1 µm to 100 µm or, even more preferably, in the range of 1 µm to 10 µm, and can be, for example, printed out. In such embodiments, regarding current ranges, it is desirable to minimize the currents. In an embodiment, the basic fabric can be an insulating material such as Teflon. A SSD can be incorporated with medical devices that can self-sterilize in a specific area or zone on the device to minimize the buildup of surface proteins, collagen, scar tissue or other materials to extend the operation, safety and efficacy of the device.

SSDs can incorporate electrodes having a variety of electrode structures, materials, and components. Specific embodiments can incorporate the electrodes and electroactive components composed of any or all of the following: (1) electro-conductive polymers can be used in the construction of the device to control surface activation, channeling of plasma energy, perform localized or zone specific sterilization, and to lower the cost of manufacture; (2) transparent conducting nanotube films can be used in the construction of the device to control surface activation, channeling of plasma energy, perform localized or zone specific sterilization, and to lower the cost of manufacture; and (3) polymers doped with nanoparticles of silver, gold, copper, aluminum or other conductive or semi-conductive materials to control surface activation, channeling of plasma energy, perform localized or zone specific sterilization, and to lower the cost of manufacture.

Each SSD can utilize electrodes, insulators, and electroactive components to create sterilizing plasmas. The plasma fields used to generate the self-sterilization process can be controlled by some or all of the variables listed in Table I.

TABLE I

| Variable | Typical Operation Range | Considerations |
| --- | --- | --- |
| Voltage | 0.1 V-10 kV RMS or DC | |
| Current | µA-A | Device Specific |
| Pulse Frequency | 0.1 kHz-1 MHz or DC | |
| Distribution of electrodes | | Device Specific |
| Surface Exposure Time | | |
| Electrode Placement | Number of Electrodes per unit area | Device Specific |
| Electrode Materials | Copper, platinum, and alloys | Metals, conductive polymers, Nanotubes and Nanotube films |
| Conducting Materials | Copper, platinum, and alloys | Metals, conductive polymers, doped polymers, Nanotubes and Nanotube films, nanomaterials |
| Insulating Materials | Teflon, PCB, FR4, and Ceramics | Plastics, doped polymers, Nanotubes and Nanotube films, nanomaterials |
| Ionizing Radiation | Atmospheric temperature and pressure | |

The plasma can be made continuous by using pulsed excitation of the electrodes in the range of 0.1 kHz to 10 MHz. Direct current (DC) can also be used, such as pulsed DC. Specific embodiments can use 0.1V -10 kV DC. Plasma can be generated by exciting the adjacent electrodes in a phase controlled manner. Current levels from 1 µA to 1 A can be used in specific embodiments.

Various SSDs which can be used as loads in embodiments of the subject invention can improve the ability to minimize the transmission of infectious diseases of the blood, urine, saliva, etc. or the spread of bacteria, viruses, cancer cells, pathogens or other forms of contamination. Embodiments can be incorporated in the food processing equipment and surfaces to minimize the growth of bacteria or other contaminants. Further embodiments can be used in air purification devices that have self-sterilizing plates or air filters used for respiratory care including: masks, hospital rooms, airplane air filtration, clean rooms, etc. or involve air passing between surfaces. A mask can be fitted with self-sterilizing electrodes such that the mask can be worn and then self-sterilized when laid down.

Devices that can be applied to contaminated surface to sterilize them or provide a sterile barrier. A self-sterilizing electrode cloth can be wrapped around or cover laboratory diagnostic equipment in contact with the patient. After the procedure, the cloth is removed and then activated to self-sterilize and then reused for the next patient or procedure. An example of an application for various embodiments of the invention includes triage, where caregivers dealing with many injured people and going from person to person can use a device that can self-sterilize between patients. This can allow reuse of items that might otherwise be discarded or unusable until sterilization by a separate apparatus.

SSDs can include dielectric barrier discharge (DBD), where a first dielectric coated electrode, or set of electrodes, is exposed at the surface to the surrounding atmosphere (or covered with a coating) and a second electrode, or set of electrodes, is embedded inside a layer of insulator. A voltage can be applied between the first electrode, or set of electrodes, and the second electrode, or set of electrodes, to create a plasma at the surface. In order to disperse the plasma in a continuous fashion over the surface phase lagged electrode circuitry may be employed. The phase lagged electrode circuitry applies voltages across corresponding electrodes from the first set of electrodes and the second set of electrodes, which form electrode pairs, such that different electrode pairs are excited with voltages having a phase lag compared with the voltage applied to the adjacent electrode pair. In an embodiment, the electrode spacing in each direction is such that the discharge is on both sides of the electrode. One set of electrodes may be powered with a pulsing AC or DC voltage and the other electrode set can be grounded. For AC voltage various waveforms can be utilized, such as sinusoidal, ramp, and sawtooth waveforms. The electrodes may also be operated at a beat frequency. In addition, application of fixed potential (DC) can be implemented. The electrode spacing may vary from, for example, a few microns to several mm. The plasma exposure time required for self-sterilization may vary between a few microseconds to several milliseconds. For complete eradication of some organic substance exposure for several seconds may be necessary.

In an embodiment, a SSD can include a laminate material having layers of electrodes, dielectrics, and sensors. A series of fine laser ablated holes or slots can be produced to create apertures through the laminate material. Equipotential surfaces can be maintained at a voltage difference. An alternating or direct voltage may be applied across surfaces. A plasma discharge can be generated through the holes and ejected outward in one or both directions. In this way, the surface can be self-sterilized on one or both surfaces. Insulator materials such as Teflon, PCB, FR4, and Ceramics can be used in the laminate material to provide insulation between the surfaces. Electrode material such as copper, platinum, and alloys can be used as electrode materials for the surfaces. Selection of materials and the resulting surface tension can impact the selection of hole size.

Stretchable material can be used in order to control pore patterns. In an embodiment, the self-sterilizing laminate material can be incorporated with technology used in autoclaving equipment, gamma sterilization, sterile materials, chemicals, and/or processes that sterilize equipment and devices. Various embodiments of the invention can incorporate one or more active surfaces, where an active surface of a self-sterilizing device can be in either a sterile state or a contaminated state, and the active surface can be re-sterilized by the device through the process of self-sterilization. The active surface can used for a particular purpose, such as keeping a scalpel tip sterile. The sterile state of the active surface can be continuously or intermittently maintained by the device. Active surface self-sterilization can be initiated with or without the intervention of an end-user or other person, object, or external device. In embodiments, the self-sterilizing device is capable of sensing if the active surface has been contaminated or potentially contaminated. The self-sterilizing device can use sensors to determine the level of contamination and/or the possibility of contamination. Sensors can provide feedback on the state of the device before sterilization, during sterilization and/or after the sterilization cycle has occurred. Sensors can be used to provide feedback on the level of active surface contamination before sterilization, during sterilization, and/or after the sterilization cycle has occurred. Sterilization of the active surface can be initiated by the device with or without intervention by an end-user, other person, object, or external device. Contamination, or potential contamination, of information collected by the sensors can be one or more of the following: the location of contamination, such as a particular zone of the active surface; the duration of the contact that contaminated the active surface; other physical parameters associated with the contact, such as pressure, temperature, or movement on the active surface or movement of the SSD.

A variety of sensor designs and placements can be used. In an embodiment, a sensor can be the plasma electrode or part of the plasma electrode operating in a sensing mode, instead of a sterilizing mode. An example of such a sensor includes a capacitive or continuity sensor. A sensor can be integrated with or located next to a plasma electrode. An example of such a sensor is a pressure sensor. A sensor can be located in proximity to the active surface, such as with an infrared curtain. A sensor can be located in the self-sterilizing device. An example of a such a sensor is a start/stop stitch and timer. A sensor can be located at a remote location from the device. An example of a remotely located sensor is a sensor having a wireless link to a remote control location, such as a camera watching the device. Other sensor designs and placements can also be implemented in accordance with embodiments of the invention.

A variety of sensor types can be employed as well. Safety interlocks such as infrared curtains, capacitive lockout, or other means of detection during the sterilization cycle can be used for user/patient safety. The following are examples of sensors that could be used for sensing, feedback and control of the active surface or the device itself: infrared beam to provide a curtain over the active surface or device; radio frequency field to provide a curtain over the active surface or device; motion sensor to detect movement over the active surface or of the device; acoustic beam to detect movement over the active surface or of the device; temperature sensors to determine contact by another object or change in the device; pressure sensors to determine contact by another person or object or change in the device; capacitive sensors to determine contact by another person or object or change in the device; and conductivity sensors to determine contact by another person or object or change in the device. As an example, an infrared beam can be used to provide a curtain over the active surface to detect when the surface is touched and may, therefore, need sterilization, or to monitor build up on the active surface.

In certain embodiments, the voltage potential applied to a power supply unit can be applied in a duty cycle. A duty cycle can advantageously minimize the power requirement. In each cycle of the duty cycle, the voltage potential can be applied to a system of the power supply unit for one or more portions of the cycle and not applied to that system for the other portions of the cycle. During such other portions of the cycle, the voltage potential can be applied to another system of the power supply unit or not applied to the power supply unit at all. In an embodiment, the voltage potential can be applied as a repeating cycle of one or more pulses. For example, a power supply unit can include three systems each providing power to a load, for a total of three loads. A voltage potential can be applied to each system of the power supply unit for one third (33.3%) of the cycle duration. As another example, a power supply unit can include four systems each providing power to a load, for a total of four loads. A voltage potential can be applied to each system of the power supply unit for one fourth (25%) of the cycle duration. As a further example, a power supply unit can include five systems each providing power to a load, for a total of five loads. A voltage potential can be applied to each system of the power supply unit for one fifth (20%) of the cycle duration. Such a duty cycle can be applied for any number of loads, e.g., six systems (each having a voltage potential applied one sixth of the time), seven systems (each having a voltage potential applied $(1/n)^{th}$ of the time), etc.

Embodiments of the subject invention provide power supply units that are portable and that can provide voltages in the kV range, which can, e.g., produce DBD plasma. In a specific embodiment, the power supply unit can provide voltages of at least 12 kVpp. In addition, power supply units of the subject invention can power more than one load. For example, a power supply unit can generate plasma on more than one load. Each load can be, for example, an electrode. For example, the power supply unit can either include a single system capable of running more than one load or include multiple systems, each simple and small enough so multiple systems can be put together. In the case of multiple systems, the multiple systems can be controlled by a controller. The loads can produce plasma simultaneously and/or a duty cycle can be applied. The number of loads will vary depending on, for example, the desired application and/or the desired surface area to cover.

Figure 2:
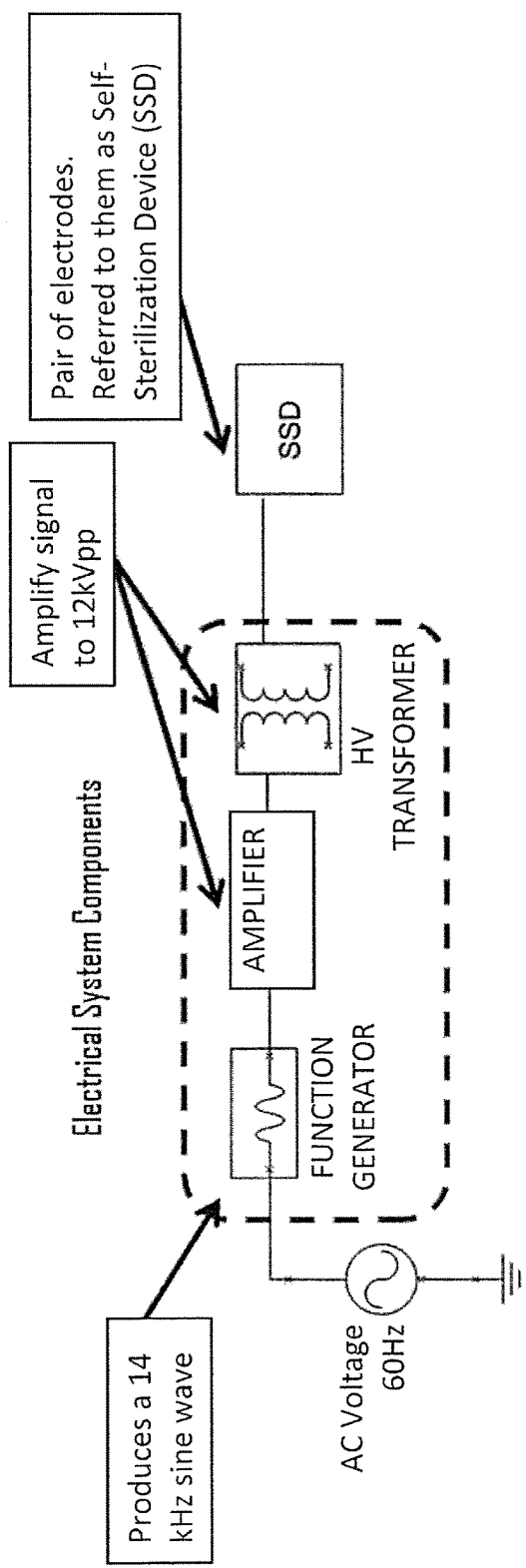
FIG. 2 shows a schematic a power supply unit according to an embodiment of the subject invention.

Referring to FIG. 2, in an embodiment, a power supply unit can include a power input supply 150 and a power amplifier including an amplifier 160 and a transformer 170. The power supply unit can be connected to multiple loads 180, such as two electrodes forming a self-sterilization device (SSD). The load can be, for example, an SSD have a size of 1.5 inches by 1.5 inches. The power input supply 150 can, in conjunction with, for example, a function generator (shown in FIG. 2), supply an AC voltage having a frequency greater than 60 Hz. In a specific embodiment, a 14 kHz signal can be produced, outputting a 60 Hz AC signal. In a further specific embodiment, amplifier 160 can be a sound power amplifier, which can accept input waveforms in the sound frequency range. The power amplifier can produce an output voltage of for example, 12 kVpp.

The power supply unit can have a frequency of operation in the kHz range. In an embodiment, a power supply unit can have a frequency of operation of at least 14 kHz. In further embodiments, a power supply unit can have a frequency of operation of any of the following values or in a range having as endpoints any of the following values: 1 kHz, 2 kHz, 3 kHz, 4 kHz, 5 kHz, 6 kHz, 7 kHz, 8 kHz, 9 kHz, 10 kHz, 11 kHz, 12 kHz, 13 kHz, 14 kHz, 15 kHz, 16 kHz, 17 kHz, 18 kHz, 19 kHz, 20 kHz, 25 kHz, 30 kHz, 35 kHz, 40 kHz, 44 kHz, 45 kHz, 46 kHz, 47 kHz, 48 kHz, 49 kHz, 50 kHz, 55 kHz, 60 kHz, 65 kHz, 70 kHz, 75 kHz, 80 kHz, 85 kHz, 90 kHz, 95 kHz, or 100 kHz.

Figure 3:
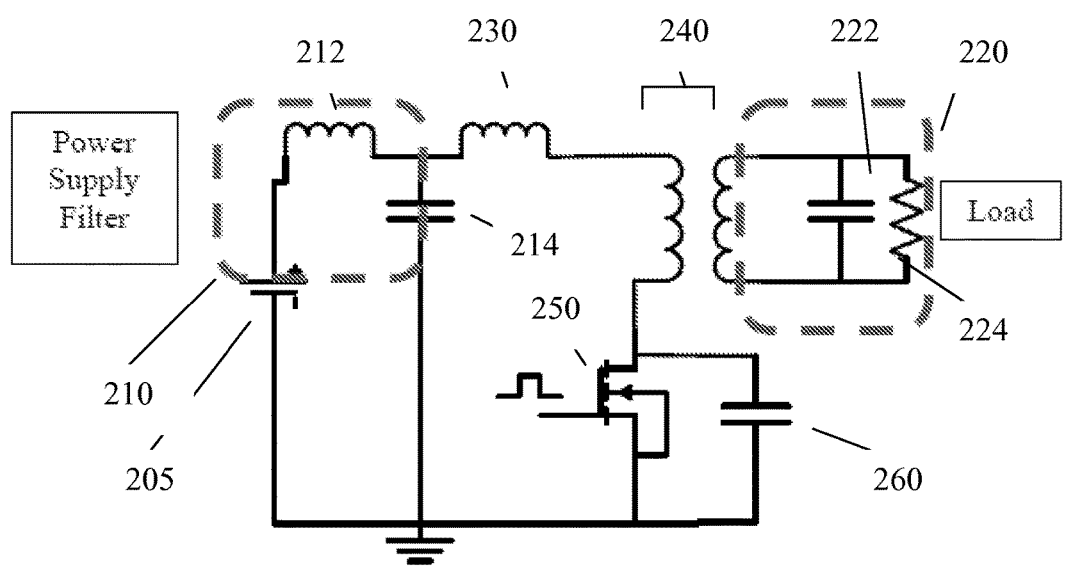
FIG. 3 shows a schematic of a circuit according to an embodiment of the subject invention.

In an embodiment, a power supply unit can include at least one system having a circuit topology including a transistor, an inductor, a capacitor, and a transformer. The transistor can be used as a switch. Such a system is an amplifier, and this amplifier is a zero-voltage switching (ZVS) amplifier, which yields 100% efficiency theoretically. Referring to FIG. 3, the transistor 250, inductor 230, capacitor 260, and transformer 240 can be arranged as depicted. The load 220, such as an electrode, can be represented by a capacitor 222 and a resistor 224 in parallel, though embodiments of the subject invention are not limited thereto. The load can be connected to the secondary side of the transformer (i.e., the other side from which the power input supply 205 system is connected. The impedance across a wide range of frequencies looking into the primary side of the transformer 240 can be measured. The self resonance frequency of the transformer 240 and the load 220 can then be selected. This can yield maximum voltage amplitude on the load 220 because maximum real impedance is seen on the primary side. The capacitor 260 (across the drain and the source of the transistor 250) can be a component with respect to allowing proper ZVS operation to be obtained and yielding a high efficiency. Because the current across the inductor 230 and the transformer 250 can oscillate, which can lead to a negative current fed back to the power input supply 205. In certain embodiments, a power supply filter 210 can be included. The power supply filter 210 can include an inductor 212 and a capacitor 214 as shown in FIG. 3. The power supply filter 210 can result in only DC current and DC voltage being drawn from the power input supply 205.

Embodiments of the power supply units in accordance with the subject invention can achieve advantageous results compared to existing amplifiers. Typically, a full bridge rectifier is only practical for a single load system. According to embodiments of the subject invention, a power supply unit can include multiple amplifiers (systems) and multiple loads and can have a simple topology with a small number of components and small size. Also, the C-shunt included in designs of the subject invention increases efficiency by helping to obtain ZVS. Power supply units of the subject invention can advantageously obtain kV-level output voltages with high efficiency. Power supply units of the subject invention advantageously achieve high efficiency with small size and simple topology, thereby allowing multiple power amplifiers (systems) and multiple loads.

Embodiments of the subject invention are advantageously capable of running multiple loads. Small and simple systems can be used that can be scaled up easily. Referring to FIG. 1, in an embodiment, a power supply unit can include multiple systems 121, 122, 123 each powering a load 131, 132, 133. The systems, or power amplifiers (PAs), can be controlled by a controller 110. Though FIG. 1 shows three systems and three loads, embodiments of the subject invention are not limited thereto.

Duty cycling can be used for applying power to the PAs. In an embodiment, the signal 140 applied to the PAs can be applied to each PA for a portion of the cycle. For example, a power supply unit can include 3 PAs each powering a load, and each PA can have a signal applied to it for one third of the cycle, as shown by way of example only in FIG. 1. In certain embodiments, the controller 110 can control the application of the signal to the PAs.

Figure 4:
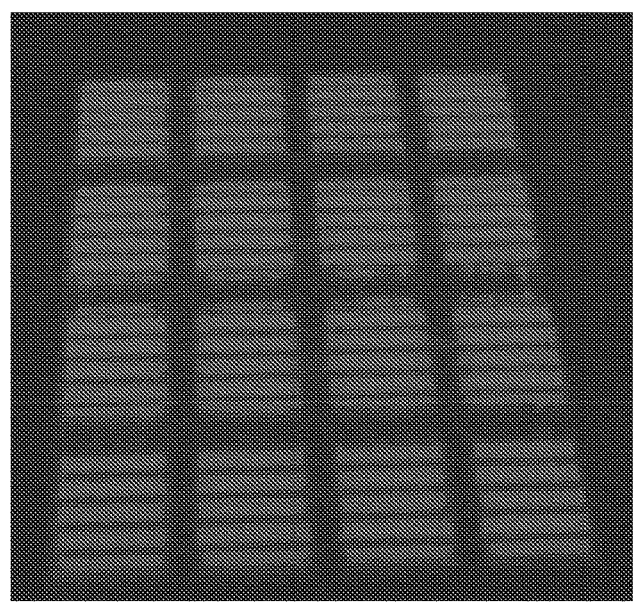
FIG. 4 shows a photograph of an electrode with addressable cells.

In an embodiment, the loads of a power supply unit can be addressable, meaning only sections of the total surface will be on or off depending on the desired application. FIG. 4 shows an electrode with addressable cells (a multiple load surface).

In certain embodiments, the power input supply of the PAs or systems is duty cycled. Duty cycling the power supply of the PAs can be much easier than duty cycling the output of the PAs. In many cases, the output of each PA can have a voltage in the thousands of volts (e.g., 12 kVpp), which can make it difficult to switch on and off using a relay. Off-the-shelf components capable of switching such high voltages can be bulky and expensive. In addition, the relay switch can be equivalent to a capacitor when it is in the OFF state with a capacitance comparable to the load. This can lead to the voltage across the electrode not being zero when it should be OFF. Instead, the voltage has across the electrode can be decreased to a level at which plasma is not produced, while still having a voltage drop across the electrode (e.g., in the 100s of volts). Thus, in this way the voltage drop is displaced from the load to the switch, which means the system is still running and consuming power, which is highly inefficient. Thus, embodiments of the subject invention can include duty cycling (or switching on and off) the power input supply of the PAs. Because these are low DC voltages, in specific embodiments, transistors can be used instead of relay switches, thereby helping decrease size and increase efficiency.

In an embodiment of the subject invention, a method of powering at least two loads can include providing a power supply unit having at least one power amplifier. Each power amplifier can have a circuit topology including a transistor, an inductor, a capacitor, and a transformer. The transistor can be used as a switch. Referring again to FIG. 3, the transistor 250, inductor 230, capacitor 260, and transformer 240 can be arranged as depicted. The load 220, such as an electrode, can be represented by a capacitor 222 and a resistor 224 in parallel, though embodiments of the subject invention are not limited thereto. The load can be connected to the secondary side of the transformer (i.e., the other side from which the power input supply 205 system is connected). In certain embodiments, a power supply filter 210 can be included. The power supply filter 210 can include an inductor 212 and a capacitor 214 as shown in FIG. 3.

The method can further include applying a duty cycle to the power supply unit. Each power amplifier can be connected to a single load, thereby powering that load. Each load can be, for example, an electrode.

The power amplifier(s) can be controlled by a controller such that the controller controls the power input supply to the power amplifier(s). The duty cycle can be applied such that the input voltage from the power input supply is applied to each power amplifier for only a portion of the cycle. The input voltage can be applied proportionally in a temporal sense such that each power amplifier has the input voltage applied to it for the same amount of time as every other power amplifier during each cycle of the duty cycle. For example, if the power supply unit includes X power amplifiers, each power amplifier has the input voltage applied to it for 1/X of each cycle of the duty cycle, and the input voltage is not applied to that power amplifier for the remainder of the cycle. In an embodiment, the input voltage can be in a range of from 18 V to 24 V. In further embodiments, the input voltage can be any of the following values or in a range having as endpoints any of the following values: 1 V, 2 V, 3 V, 4 V, 5 V, 6 V, 7 V, 8 V, 9 V, 10 V, 11 V, 12 V, 13 V, 14 V, 15 V, 16 V, 17 V, 18 V, 19 V, 20 V, 21 V, 22 V, 23 V, 24 V, 25 V, 26 V, 27 V, 28 V, 29 V, 30 V, 40 V, 45 V, 50 V, 55 V, 60 V, 65 V, 70 V, 75 V, 80 V, 85 V, 90 V, 95 V, 100 V, or 1 kV.

In an embodiment, the footprint of the power supply unit can be less than 45 in$^2$. In further embodiments, the footprint of the power supply unit can be less than, e.g., 40 in$^2$, 35 in$^2$, 30 in$^2$, 29 in$^2$, 28 in$^2$, 27 in$^2$, 26 in$^2$, 25 in$^2$, 24 in$^2$, 23 in$^2$, 22 in$^2$, 21 in$^2$, 20 in$^2$, 19 in$^2$, 18 in$^2$, 17 in$^2$, 16 in$^2$, 15 in$^2$, 14 in$^2$, 13 in$^2$, 12 in$^2$, 11 in$^2$, 10 in$^2$, 9 in$^2$, 8 in$^2$, 7 in$^2$, 6 in$^2$, 5 in$^2$, 4 in$^2$, 3 in$^2$, 2.25 in$^2$, 2 in$^2$, 1 in$^2$, or 0.5 in$^2$. The power supply unit can be very lightweight. In an embodiment, a power supply unit can have a weight of less than 100 grams (g). In a further embodiment, a power supply unit can have a weight of less than 85 g. In further embodiments, a power supply unit can have a weight of less than, e.g., 95 g, 90 g, 80 g, 75 g, 70 g, 65 g, 60 g, 55 g, 50 g, 45 g, 40 g, 35 g, or 30 g. The power supply unit can provide voltages in the kV range. In an embodiment, a power supply unit can provide a voltage of at least 12 kVpp. In further embodiments, a power supply unit can provide a voltage of at least, e.g., 1 kVpp, 2 kVpp, 3 kVpp, 4 kVpp, 5 kVpp, 6 kVpp, 7 kVpp, 8 kVpp, 9 kVpp, 10 kVpp, 11 kVpp, 12 kVpp, 13 kVpp, 14 kVpp, 16 kVpp, 17 kVpp, 18 kVpp, 19 kVpp, 20 kVpp, 21 kVpp, 22 kVpp, 23 kVpp, 24 kVpp, 25 kVpp, 26 kVpp, 27 kVpp, 28 kVpp, 29 kVpp, or 30 kVpp.

The methods of the subject invention can provide voltage to at least 2 loads. Each load can be, for example, an electrode, such as an electrode used for plasma generation. In further embodiments, a power supply unit can provide voltage to at least, e.g., 3 loads, 4 loads, 5 loads, 6 loads, 7 loads, 8 loads, 9 loads, 10 loads, 11 loads, 12 loads, 13 loads, 14 loads, 15 loads, 16 loads, 17 loads, 18 loads, 19 loads, or 20 loads.

In an embodiment of the subject invention, a method of manufacturing a power supply unit can include forming at least one power amplifier. Each power amplifier can have a circuit topology including a transistor, an inductor, a capacitor, and a transformer. The transistor can be used as a switch. Referring again to FIG. 3, the transistor 250, inductor 230, capacitor 260, and transformer 240 can be arranged as depicted. The load 220, such as an electrode, can be represented by a capacitor 222 and a resistor 224 in parallel, though embodiments of the subject invention are not limited thereto. The load can be connected to the secondary side of the transformer (i.e., the other side from which the power input supply 205 system is connected). In certain embodiments, a power supply filter 210 can be included. The power supply filter 210 can include an inductor 212 and a capacitor 214 as shown in FIG. 3. The method can further include connecting each power amplifier to a controller.

In an embodiment, the footprint of the power supply unit can be less than 45 in$^2$. In further embodiments, the footprint of the power supply unit can be less than, e.g., 40 in$^2$, 35 in$^2$, 30 in$^2$, 29 in$^2$, 28 in$^2$, 27 in$^2$, 26 in$^2$, 25 in$^2$, 24 in$^2$, 23 in$^2$, 22 in$^2$, 21 in$^2$, 20 in$^2$, 19 in$^2$, 18 in$^2$, 17 in$^2$, 16 in$^2$, 15 in$^2$, 14 in$^2$, 13 in$^2$, 12 in$^2$, 11 in$^2$, 10 in$^2$, 9 in$^2$, 8 in$^2$, 7 in$^2$, 6 in$^2$, 5 in$^2$, 4 in$^2$, 3 in$^2$, 2.25 in$^2$, 2 in$^2$, 1 in$^2$, or 0.5 in$^2$. The power supply unit can be very lightweight. In an embodiment, a power supply unit can have a weight of less than 100 grams (g). In further embodiments, a power supply unit can have a weight of less than, e.g., 95 g, 90 g, 85 g, 80 g, 75 g, 70 g, 65 g, 60 g, 55 g, 50 g, 45 g, 40 g, 35 g, or 30 g. The power supply unit can provide voltages in the kV range. In an embodiment, a power supply unit can provide a voltage of at least 12 kVpp. In further embodiments, a power supply unit can provide a voltage of at least, e.g., 1 kVpp, 2 kVpp, 3 kVpp, 4 kVpp, 5 kVpp, 6 kVpp, 7 kVpp, 8 kVpp, 9 kVpp, 10 kVpp, 11 kVpp, 12 kVpp, 13 kVpp, 14 kVpp, 16 kVpp, 17 kVpp, 18 kVpp, 19 kVpp, 20 kVpp, 21 kVpp, 22 kVpp, 23 kVpp, 24 kVpp, 25 kVpp, 26 kVpp, 27 kVpp, 28 kVpp, 29 kVpp, or 30 kVpp.

A dielectric barrier plasma discharge at atmospheric pressure (APDBD) discharge can be produced when an alternating voltage is applied between two electrodes separated by a dielectric material. The voltage produces an electric field large enough to cause electrical breakdown. The peak voltage can depend on the distance between the electrodes, the dielectric constant of the dielectric material, and the pressure. In an embodiment of the subject invention, plasma can be produced at atmospheric pressure using two electrodes separated by a dielectric. The electrodes can be, for example, metal electrodes, and the dielectric material can be, for example, FR4 material, though embodiments are not limited thereto. The dielectric material can have a thickness in a range of from 1 µm to 1 cm. For example, the dielectric material can have a thickness of 1.54 mm. The peak voltage can be at least 4 kV, but should not be so high as to cause a short across the electrodes. The DBD discharge can be extinguished when the electrical current is terminated or the electric field collapses.

Such an APDBD device can be used for a variety of applications, including as a plasma sterilizer able to kill bacteria located on the surface. The surface can sometimes have small quantities of liquid thereon due to contamination. Once plasma is generated across the surface, this liquid can gradually evaporate. This can cause a change in impedance as the plasma is generating, meaning that a power supply should be able to handle a variable impedance in the load (or loads).

In an embodiment, a power supply unit can be configured to deliver power to one or more variable loads. For example, the power supply unit can be configured to deliver power to one or more loads with the same efficiency while the impedance of the one or more loads changes. That is, the impedance of each load can be variable and/or the overall impedance of the entire system of loads can be variable. In a specific embodiment, the power supply unit can deliver power to one or more loads, providing the power at the same frequency (e.g., the resonant frequency), within an error of 0.1%, while the impedance of the one or more loads changes. Similarly, the power supply unit can deliver power to one or more loads, providing the same amount of power, within an error of 0.1%, while the impedance of the one or more loads changes.

In several embodiments, a system of the invention can be scalable. For example, a system of the subject invention can sterilize a surface having an area in a range of from 0.5 in$^2$ to 15 in$^2$. In an embodiment, a system of the subject invention can sterilize a surface having an area in a range of from 1 in$^2$ to 10 in$^2$. For example, a system of the subject invention can sterilize a surface having an area of about 4 in$^2$. In an embodiment, a power supply unit or power amplifier of the subject invention can be configured to generate plasma across a small surface (e.g., a cell having an area of 1 in$^2$) and then use multiple power amplifiers to power other cells. The power amplifier can operate on a duty cycle such that only one cell is powered at a time.

The power supply unit can have a frequency of operation in the kHz range. In an embodiment, a power supply unit can have a frequency of operation of at least 14 kHz. In further embodiments, a power supply unit can have a frequency of operation of any of the following values or in a range having as endpoints any of the following values: 1 kHz, 2 kHz, 3 kHz, 4 kHz, 5 kHz, 6 kHz, 7 kHz, 8 kHz, 9 kHz, 10 kHz, 11 kHz, 12 kHz, 13 kHz, 14 kHz, 15 kHz, 16 kHz, 17 kHz, 18 kHz, 19 kHz, 20 kHz, 25 kHz, 30 kHz, 35 kHz, 40 kHz, 44 kHz, 45 kHz, 46 kHz, 47 kHz, 48 kHz, 49 kHz, 50 kHz, 55 kHz, 60 kHz, 65 kHz, 70 kHz, 75 kHz, 80 kHz, 85 kHz, 90 kHz, 95 kHz, or 100 kHz.

In many embodiments, a power supply unit can provide voltages in the kilovolt (kV) range. In an embodiment, a power supply unit can provide a voltage of at least 6 kV peak-to-peak (pp). In further embodiments, a power supply unit can provide a voltage of at least, e.g., 1 kVpp, 2 kVpp, 3 kVpp, 4 kVpp, 5 kVpp, 6 kVpp, 7 kVpp, 8 kVpp, 9 kVpp, 10 kVpp, 11 kVpp, 12 kVpp, 13 kVpp, 14 kVpp, 16 kVpp, 17 kVpp, 18 kVpp, 19 kVpp, 20 kVpp, 21 kVpp, 22 kVpp, 23 kVpp, 24 kVpp, 25 kVpp, 26 kVpp, 27 kVpp, 28 kVpp, 29 kVpp, or 30 kVpp.

In an embodiment, a power supply unit of the subject invention can be configured to power a variable load or multiple loads, one or more of which may be a variable load.

Figure 11:
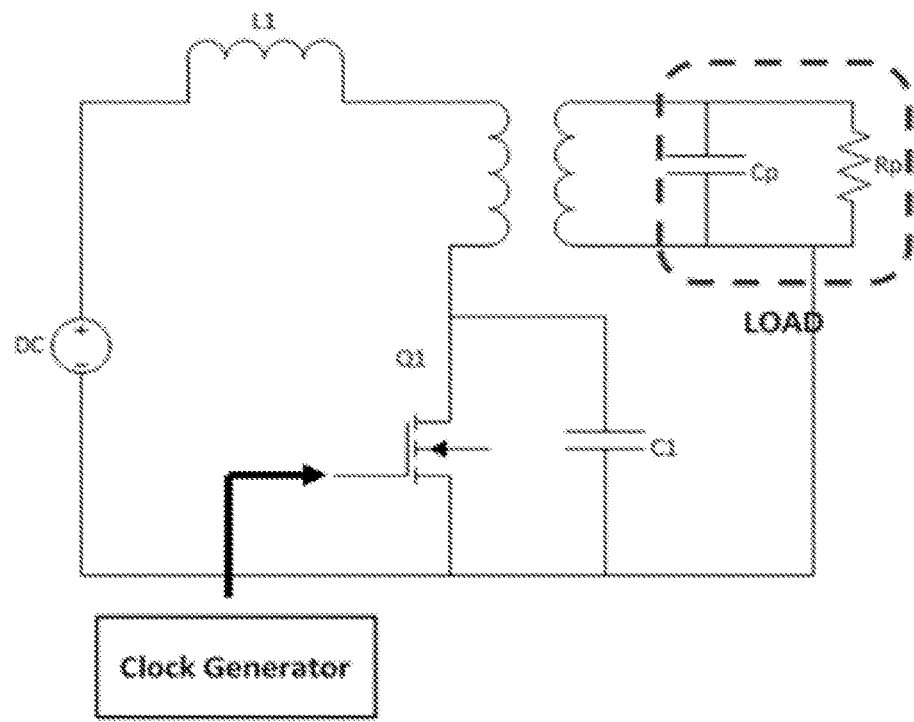
FIG. 11 shows a circuit topology, according to an embodiment of the subject invention, for generating plasma across a SSD.
Figure 12:
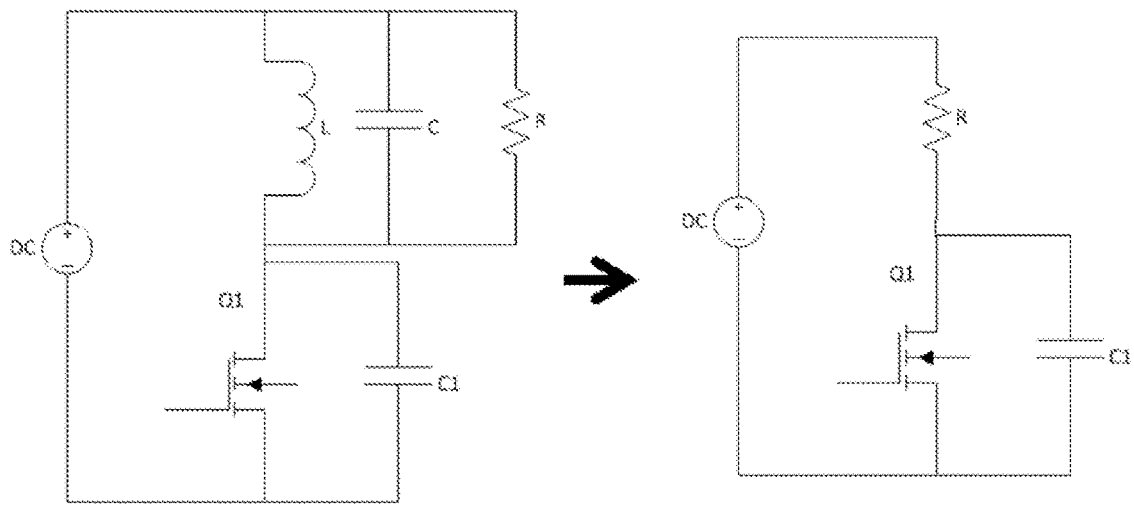
FIG. 12 shows a schematic of a circuit showing that an RLC tank can look purely resistive.

In many embodiments, a power supply unit can have a footprint that is about the size of a human hand or less. For example, the footprint of the power supply unit can be less than 45 square inches (in$^2$). In further embodiments, the footprint of the power supply unit can be less than, e.g., 40 in$^2$; 35 in$^2$, 30 in$^2$, 29 in$^2$, 28 in$^2$, 27 in$^2$, 26 in$^2$, 25 in$^2$, 24 in$^2$, 23 in$^2$, 22 in$^2$, 21 in$^2$, 20 in$^2$, 19 in$^2$, 18 in$^2$, 17 in$^2$, 16 in$^2$, 15 in$^2$, 14 in$^2$, 13 in$^2$, 12 in$^2$, 11 in$^2$, 10 in$^2$, 9 in$^2$, 8 in$^2$, 7 in$^2$, 6 in$^2$, 5.25 in$^2$, 5 in$^2$, 4 in$^2$, 3.5 in$^2$, 3.4 in$^2$, 3.36 in$^2$, 3.35 in$^2$, 3 in$^2$, 2.25 in$^2$, 2 in$^2$, 1 in$^2$, or 0.5 in$^2$. In an embodiment, the power supply unit can be in the shape of a thin plate, and the face of the power supply unit can provide the footprint. FIG. 11 shows a circuit topology, according to an embodiment of the subject invention, for generating plasma across a SSD. The inductor L1 is integral to the system. This circuit is a DC-AC inverter zero-voltage-switching (ZVS) power amplifier. In this circuit, the transistor is operated as a switch. The current and the voltage waveforms of the transistor provide a condition when the high current and the high voltage do not overlap simultaneously that minimizes the power dissipation and maximizes the power amplifier efficiency. Unlike a Class-E amplifier, the input current is not purely DC; it has a high oscillation becoming reverse in direction in a certain time interval. This may cause a reverse breakdown in the transistor, and the amplifier may fail to function. However, the power MOSFET in use has a built-in diode across its source and drain. This diode can inhibit reverse breakdown of the transistor and keep the amplifier operational. The frequency of operation can be chosen so that the transformer and SSD resonate, yielding a high output voltage swing. However, at resonance, the RLC tank looks purely resistive, which can inhibit proper conditions for the amplifier (see FIG. 12).

Figure 13:
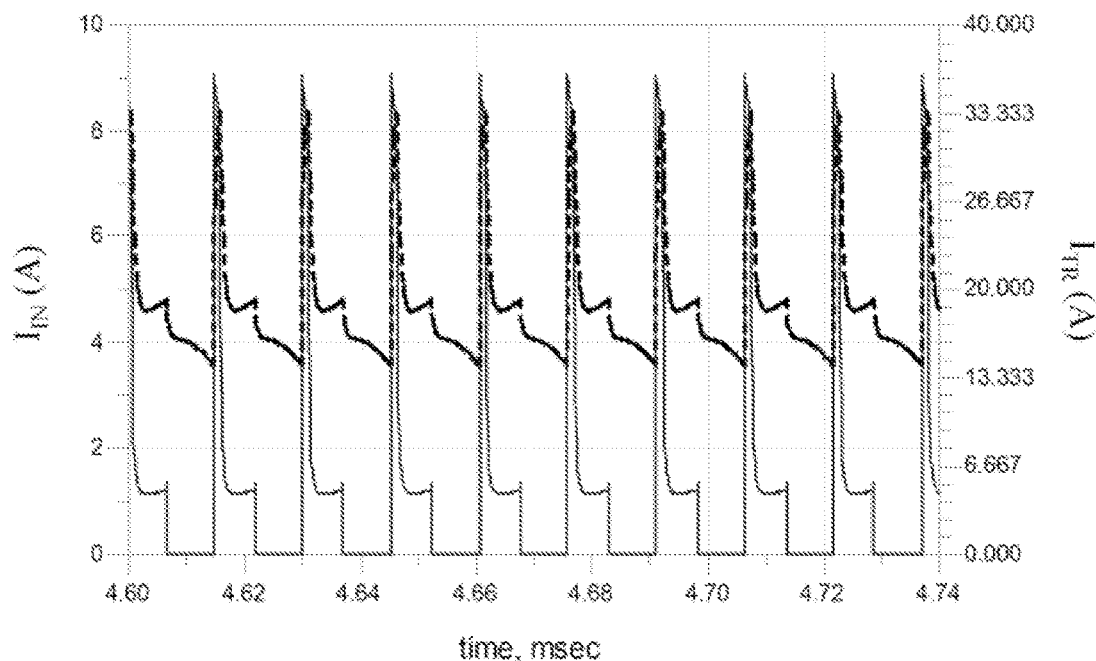
FIG. 13 shows a plot of input current (dashed line) over time.

FIG. 13 shows the input current (dashed line), which does not resemble a sine wave. Instead, it looks like a train of pulses reaching values close to 9 Amps. The solid line represents the current across the transistor (the drain current), which reaches values up to 35 Amps. Meanwhile, the output voltage resembles the waveform of the input current, consisting of high voltage pulses reaching close to 3 kV. These results show poor operation of the power amplifier, meaning that the use of L1 is needed. This inductor is needed to yield a proper operation of the system. The following are the equations which can used to derive the inductance and the capacitance of the inductor and the capacitor.

$$K_1 = \omega L_1/R_t \quad (3)$$

$$K_2 = \omega C_1 R_t \quad (4)$$

$$K_0 = P_T R_t/V_{cc}^2 \quad (5)$$

Figure 14:
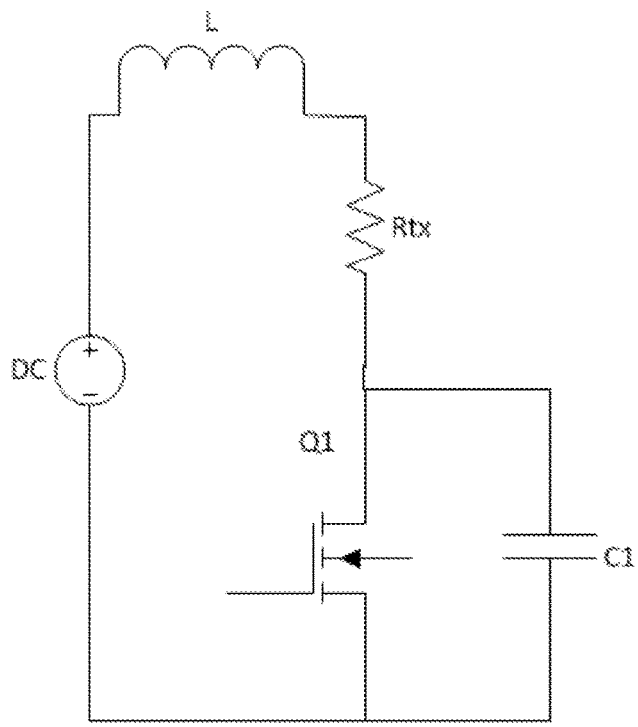
FIG. 14 shows an equivalent circuit at resonance, according to an embodiment of the subject invention.

For a duty cycle of 50%, $P_T$=15 W, and $V_{cc}$=20 V, $K_0$=1.9158, $K_1$=0.4100, and $K_2$=1.0253. Using (3), (4), and (5) yields $L_1$=71 μH and $C_1$=68 nF. FIG. 14 shows the equivalent circuit at resonance. The value of Rtx is given by Rtx=R/n², where n is the number of turns of the transformer in use. For example, n can be 2400.

In many embodiments of the subject invention, a circuit for the system includes a feedback mechanism. When a load is an SSD, such a feedback mechanism can monitor impedance changes and adjust the frequency of operation to achieve resonance during the sterilizing time.

Figure 16:
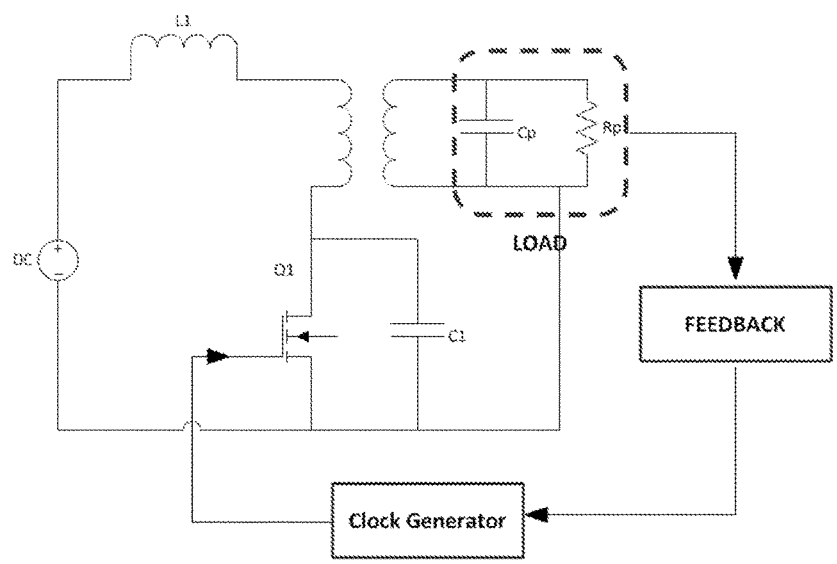
FIG. 16 shows a circuit of a power amplifier according to an embodiment of the subject invention.

Referring to FIG. 16, in an embodiment of the subject invention, a circuit of a power amplifier can include a feedback portion.

When resonance is achieved, the voltage across a load (e.g., a SSD) is the highest (for a given Vcc). This means that by monitoring the voltage drop across the load, it is possible to determine the resonance point. With a high voltage (e.g., 6 kV), it can be necessary to step down the voltage first. This can be done by, e.g., placing a capacitor in series, similar to how the Lissajous diagrams were derived (see also the left side of FIG. 17). The voltage across the series capacitor can be measured and compared to its previous value. The resonance frequency is attained when the highest voltage has been detected, and such a measurement can be taken using a microcontroller.

Although measuring the highest voltage amplitude is possible, it may not be possible to determine the actual voltage across the SSD. The capacitance of the SSD is a function of the voltage across it and the frequency of operation. Once the circuit is off resonance, the load capacitance has changed. Ideally, if this capacitance value was fixed, it could be easily determined from the series capacitor, since it is a mere voltage divider.

Figure 17:
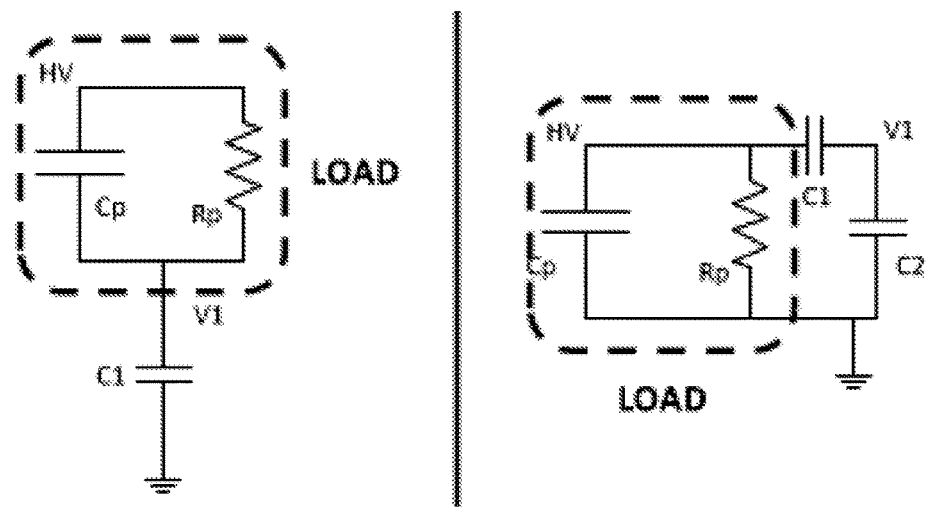
FIG. 17 shows circuits of loads according to embodiments of the subject invention.

Stepping down the voltage can also be done by, e.g., using a shunt capacitor divider, as seen in the right side of FIG. 17. This can determine the actual voltage across the load, even as the capacitance varies due to voltage and frequency change because the ratio of C1 and C2 (see right side of FIG. 17) is independent of this load variability.

Figure 18:
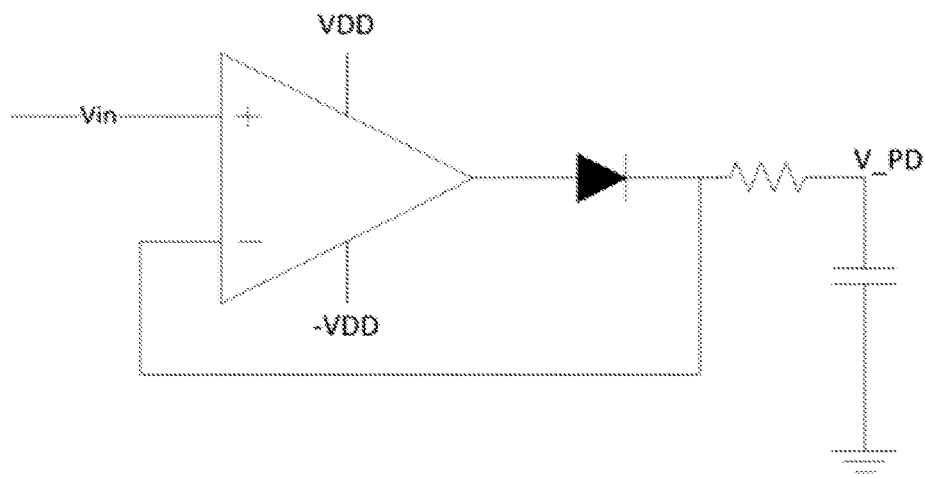
FIG. 18 shows a schematic of a peak detector.
Figure 19:
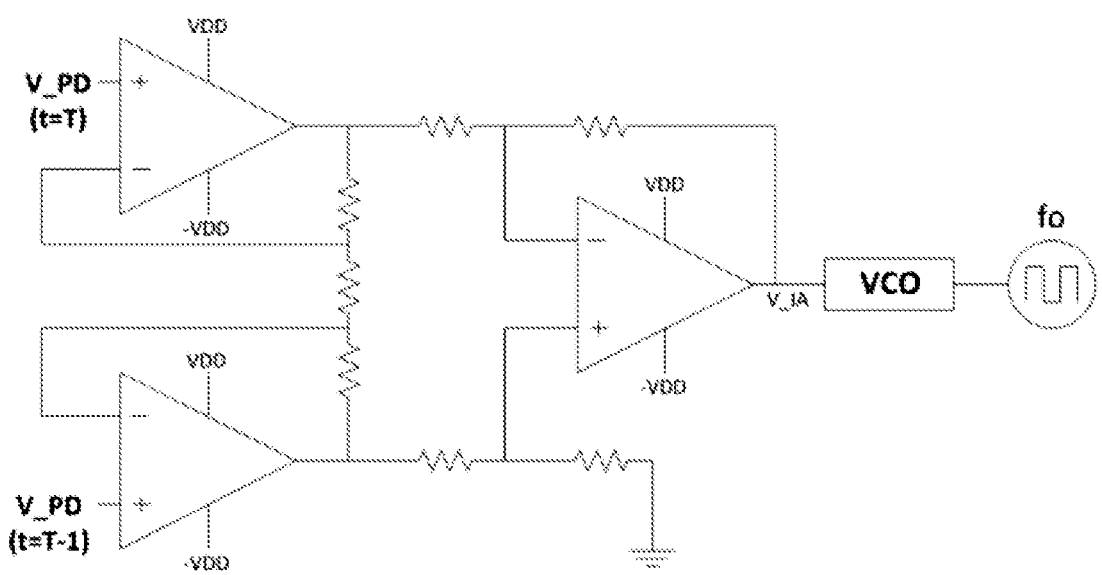
FIG. 19 shows a circuit of an instrumentation amplifier and VCO.

FIG. 16 shows a block diagram for a circuit of a power amplifier according to an embodiment of the subject invention. This circuit can include a feedback that can detect the impedance variability of the load. This variability can be detected by measuring the voltage across the load (e.g., a SSD) by means of a voltage divider. To measure this voltage and change the frequency of operation accordingly, the following can be used: a peak detector, a difference operational amplifier, and/or a voltage-controlled oscillator (VCO). The peak detector can monitor the voltage change across the load (e.g., the SSD). FIG. 18 shows an example of a schematic of a peak detector. Once this peak has been determined, it can be compared to a reference voltage which can be set by a microcontroller (previous voltage reading) by the use of an instrumentation amplifier. Then, the voltage difference between these two values can be fed into a VCO, which can change the frequency of operation accordingly. FIG. 19 shows an example circuit of an instrumentation amplifier and VCO.

EXAMPLE 1

Figure 5:
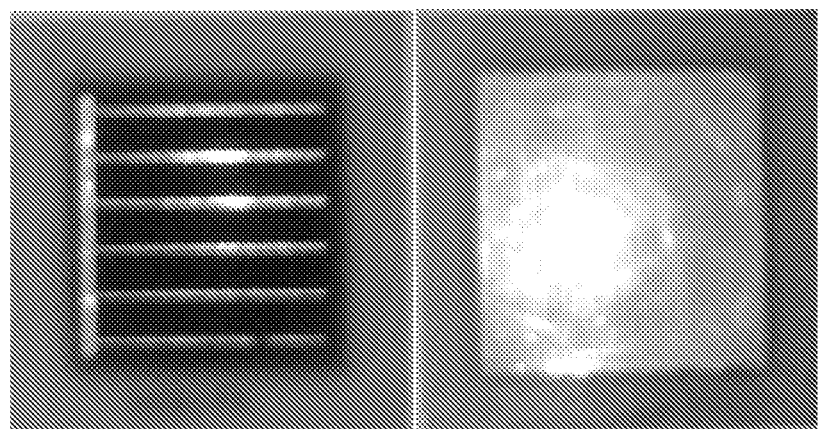
FIG. 5 shows a photograph of a self-sterilizing device (SSD) including electrodes separated by a dielectric material.

Referring to FIG. 5, a self-sterilizing device (SSD) including electrodes separated by a dielectric material is shown. Such a SSD can be used as a load for a power supply unit of the subject invention. The size of the SSD in FIG. 5 is 1.5 inches wide by 1.5 inches long.

Using an impedance analyzer (HP 4192A LF), the impedance of the device was measured to be 7 pF with high resistance (MΩ range). However, this is a low signal impedance measurement, which changes when plasma is generated on the SSD.

Figure 6:
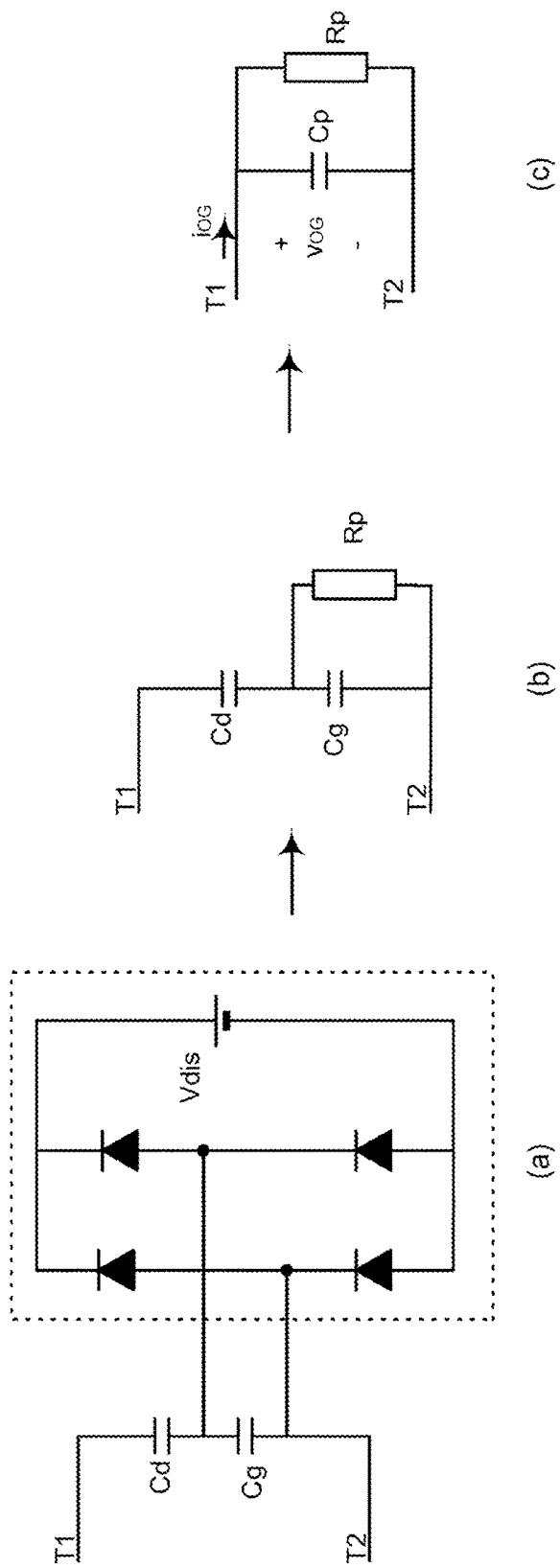
FIG. 6 shows an example of a load model for high frequency operation.
Figure 7:
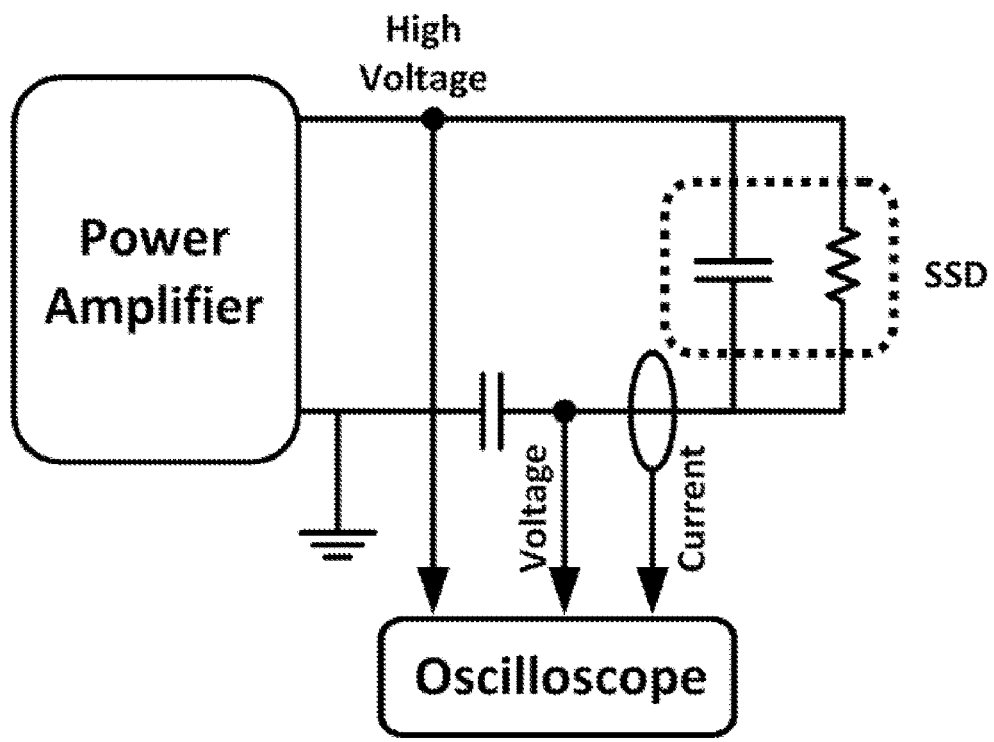
FIG. 7 shows a setup used to extract parameters.
Figure 8:
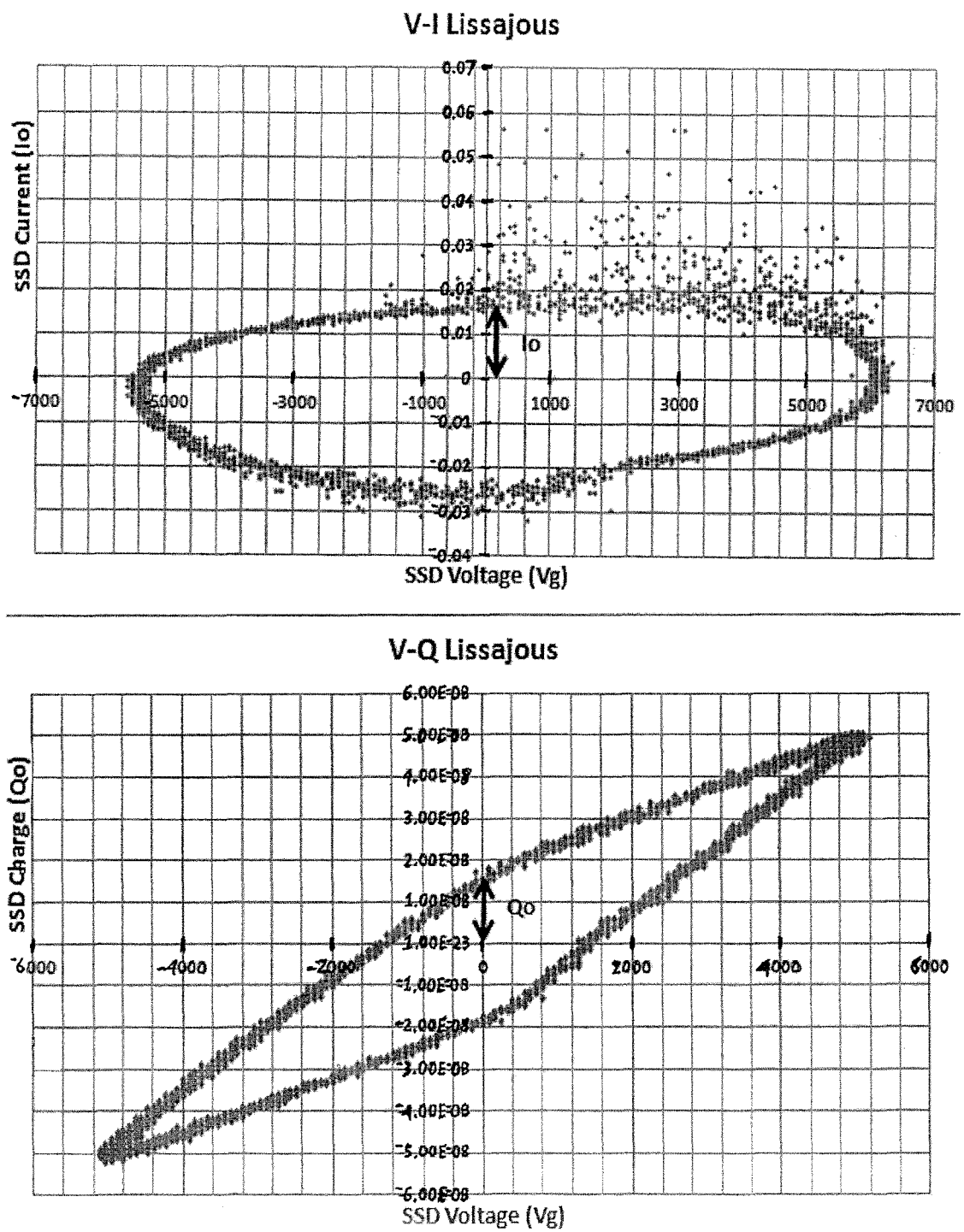
FIG. 8 shows Lissajous diagrams.

FIG. 6 shows an example of a load model for high frequency operation. The values of $C_P$ and $R_P$ were determined using Equations (1) and (2). $I_O$ and $Q_O$ were determined from their respective Lissajous diagrams, which are obtained from experimental data. The setup used to extract these two values is shown in FIG. 7. Using FIG. 8 and Equations (1) and (2), $C_P$ and $R_P$ were evaluated as 11 pF and 1.2 MΩ, respectively.

$$C_P = I_O/(2\pi f V_g) \quad (1)$$

$$R_P = V_g/(2\pi f Q_O) \quad (2)$$

Figure 9:
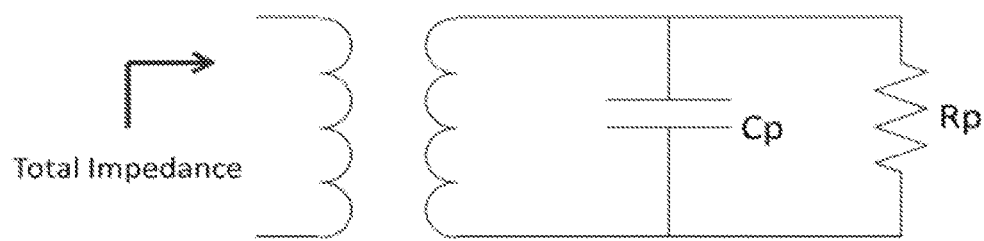
FIG. 9 shows a system, according to an embodiment of the subject invention, operated at the resonance of a transformer in parallel with a SSD.

The system must be able to apply a high voltage across the SSD so that plasma can be generated. In order to achieve this, the system was operated at the resonance of the transformer in parallel with the SSD, as seen in FIG. 9. This is possible because the SSD functions similar to a capacitor. The capacitance is magnified by the step-up turn ratio of the high voltage transformer. The capacitance can be resonated with the magnetizing inductance of the transformer.

Figure 10:
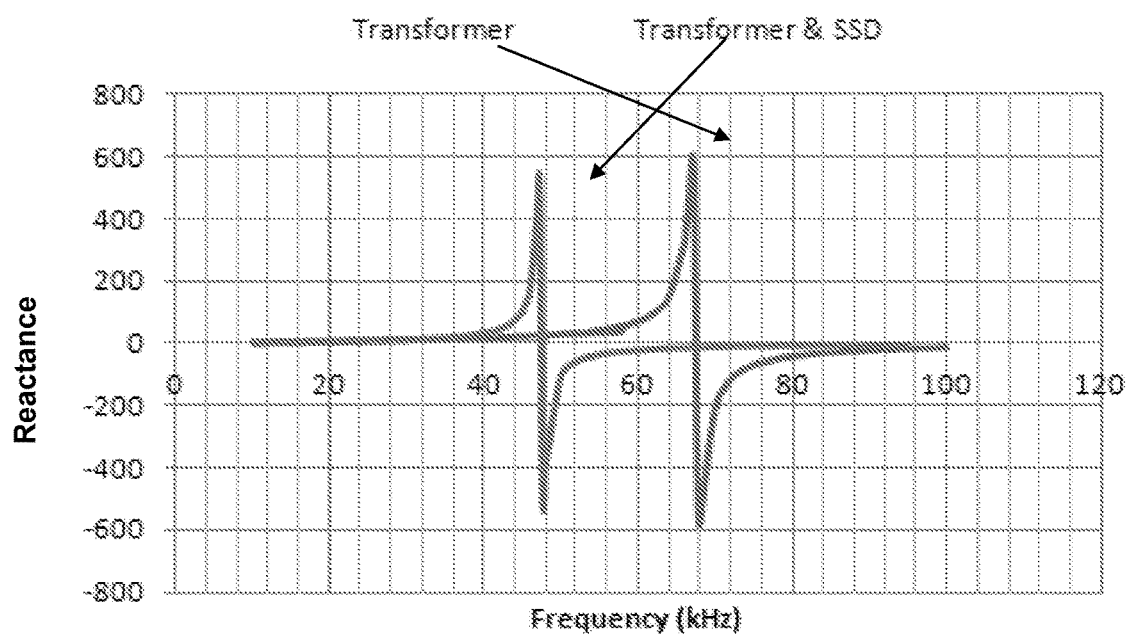
FIG. 10 shows a plot of impedance as a function of frequency for an embodiment of the subject invention.

Using the HP 4192A LF Impedance Analyzer, the impedance looking into the primary side of the high voltage transformer was measured. FIG. 10 shows this impedance as a function of frequency, from which the resonant point is easily determined for both loaded and unloaded cases.

The highest voltage (and most efficient) amplitude across the SSD is achieved at resonance, but operating close enough can ensure a high output voltage. Since a feedback mechanism is needed to deal with the load variability, the system will always operate at resonance (or close), allowing the highest output voltage. As seen in FIG. 10, the resonance frequency is 47 kHz. However, this value will change once the plasma is generated across the SSD. The load impedance changes, but the resonance frequency can be a good starting point for the design of the system.

Figure 15:
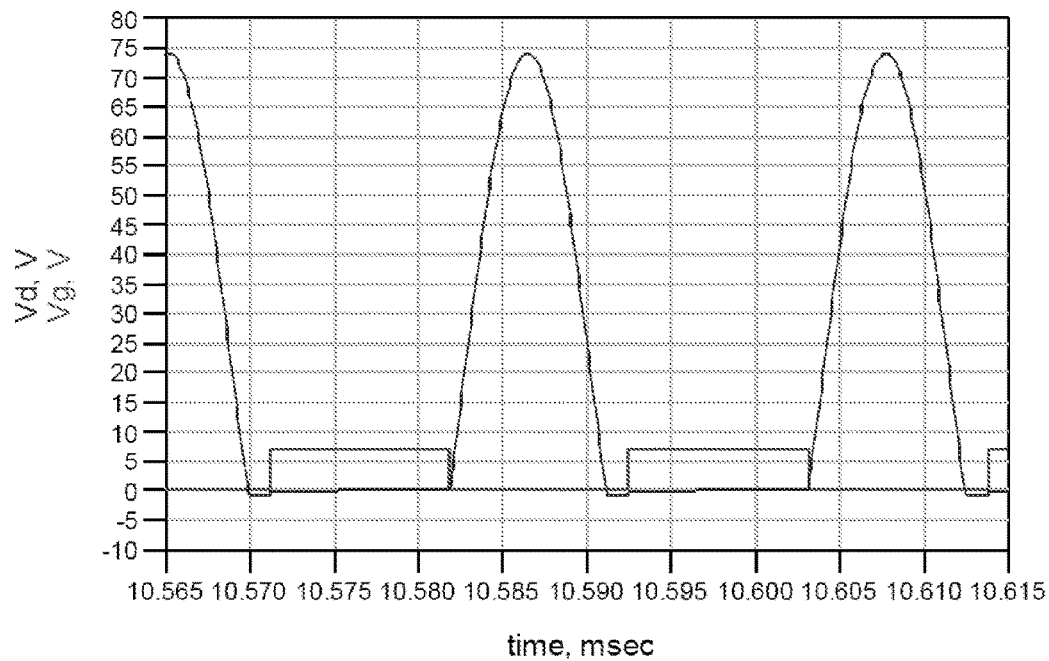
FIG. 15 shows a plot of simulation results.

FIG. 15 shows simulation results applying the component values calculated using Equations (3)-(5) discussed above. It is noted that the drain waveform drops to zero before the gate is turned on. This can be fixed by increasing the value of the capacitor to obtain the desired drain waveform.

Actual impedance change was measured by adding 40 μL of liquid on the surface of the SSD. Three mediums were used: water, salt water, and serum. This quantity was selected because, given that a drop of blood is 20 μL, using 40 μL is more than sufficient since it is not expected for the surface to be soaked in any form of liquid. Using the HP 4192A LF Impedance Analyzer, the impedance across the SSD was measured for these 3 cases (small signal measurement). The results are shown in Table 1.

TABLE 1

Impedance Change Measured With Liquid

| Liquid | SSD Impedance | SSD with 40 μL | Impedance Change | Pct. Impedance Change |
|---|---|---|---|---|
| Water | 8 pF | 19.4 PF | 11.4 pF | 144% |
| Salt Water | 8 pF | 20.6 pF | 12.6 pF | 159% |
| Serum | 8 pF | 21.1 pF | 13.1 pF | 166% |

As shown in Table 1, the impedance change using three different liquids is approximately the same. This change ranges from 144%-166%. This is a significant change in the load, and one might conclude that the resonance frequency shift will be significant as well. However, the resonance of the transformer and the load is dominated by the magnetizing inductance and even though the load changes considerably, the resonance frequency doesn't change much.

This means that in order for the system to operate optimally, the power amplifier must be able to work across the range of these frequencies: 44 kHz-48 kHz. This frequency range is not large, which makes the possibility to use the same component values across this range feasible. This can be achieved by selecting $C_1$ small enough to handle the frequency variability.

Figures 20A, 20B:
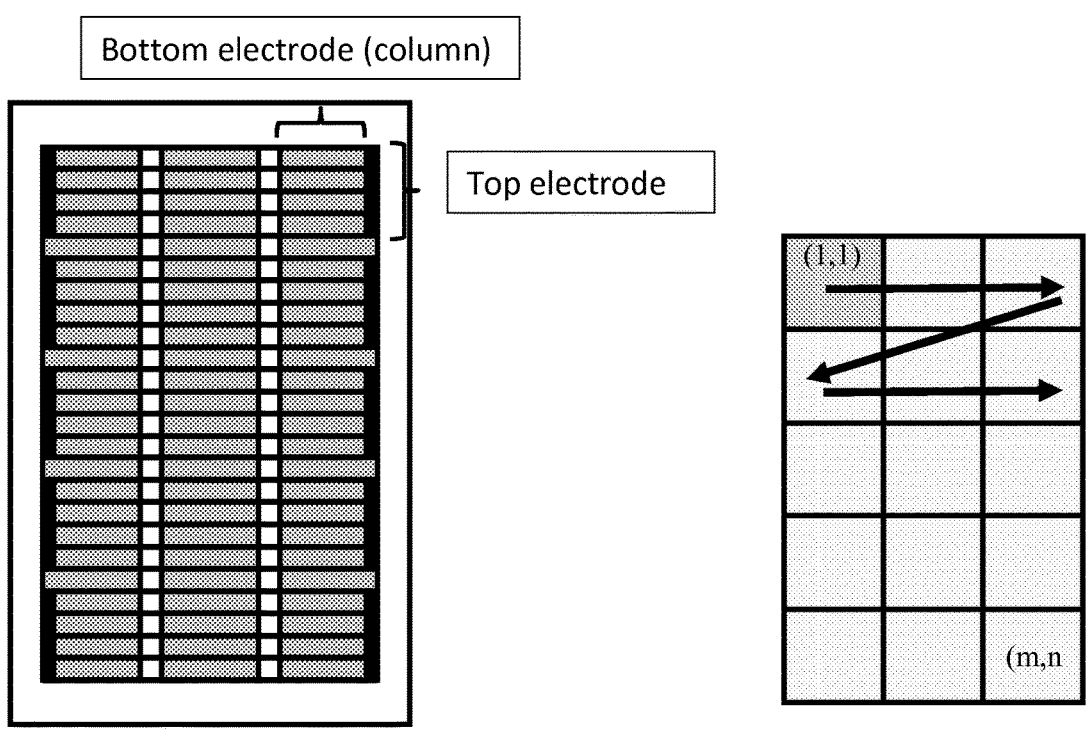
FIGS. 20A and 20B shows the electrode design for a larger surface in accordance with an embodiment of the invention.

FIGS. 20A and 20B shows the electrode design for a larger surface. It consists of columns and rows as bottom and top electrodes, respectively. This design allows the system to generate plasma on a single "cell" (area of 1" by 1") at a time, and sweep it across until the complete surface has been covered. FIG. 20A shows a large electrode array having m rows by n columns (top and bottom electrodes) and FIG. 20B shows how the plasma can be generated from right to left, one row at a time, in accordance with a specific embodiment. It starts at cell (1,1) and ends at cell (m,n), where m is the number of rows and n the number of columns. The peed of sweeping is made such that it looks as if the complete surface is on to the naked eye. This technique is comparable to the way a computer screen operates.

To generate the require voltage, two power amplifiers, such as power amplifiers discussed herein, are used with a 180 degree offset on each other. By applying each corresponding voltage to the top and bottom electrode, their difference results in a voltage of twice the amplitude of each power amplifier. Since the output voltage required by the power amplifier is reduced by half, the stress on the components are lower, which can improve reliability. In addition, components become less expensive and smaller.

Figure 21:
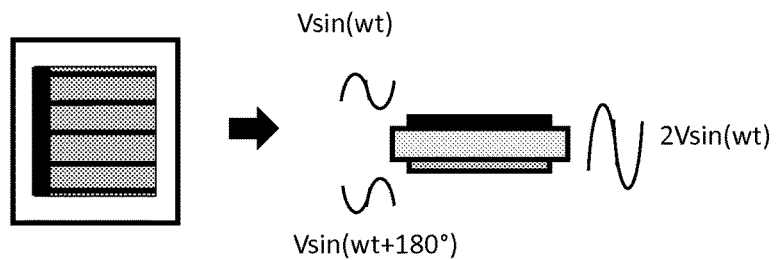
FIG. 21 shows how the applied voltages on the top and bottom electrodes, being offset by 180°, can result in a voltage of twice the amplitude of the applied voltages.

FIG. 21 shows how the applied voltages on the top and bottom electrodes, being offset by 180°, can result in a voltage of twice the amplitude of the applied voltages.

Figure 22:
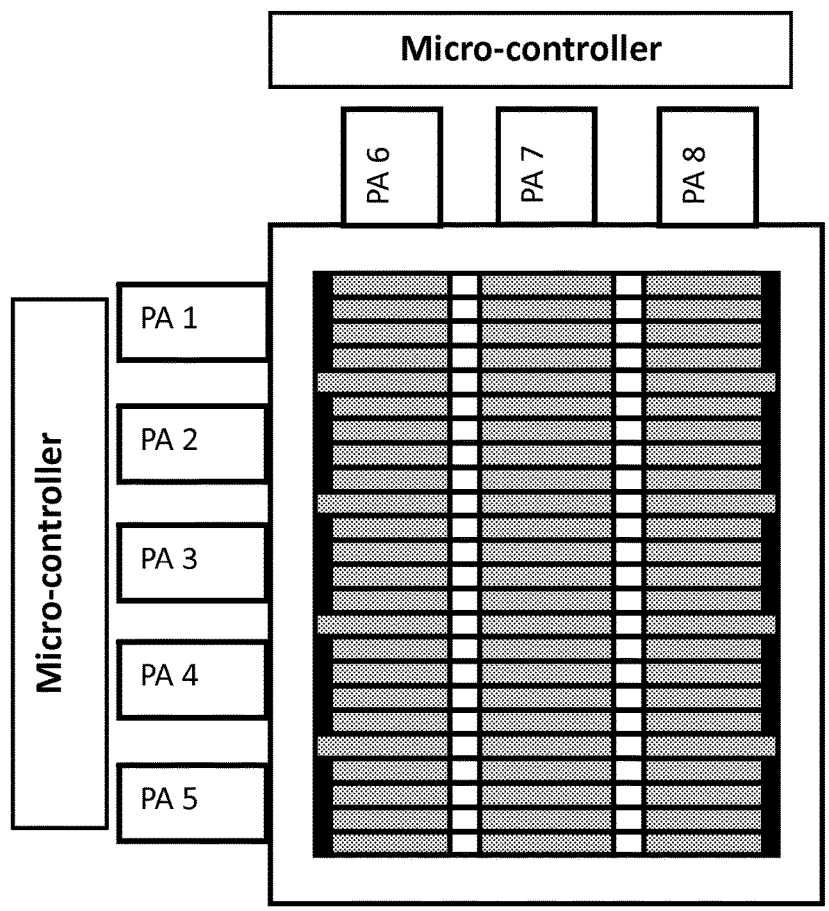
FIG. 22 shows the total number of power amplifiers used in an embodiment of the system is m+n.

The total number of power amplifiers used in an embodiment of the system is m+n, as shown in FIG. 22. The system selects each cells by controlling the power amplifiers with the use of a micro-controller.

FIG. 23 shows the logic truth table that is used to select a cell. FIG. 23 also shows that only two power amplifiers need to operate at once. In a specific embodiment, the m+n power amplifiers can be replaced by only two power amplifiers, or a number of power amplifiers between 2 and m+n. High voltage mechanical relays can be employed to connect the top and bottom electrodes to the two or more power amplifiers, in an embodiment having fewer than m+N power amplifiers. However, the relays may not fully turn off a cell. In an embodiment, each cell has a capacitance of approximately 8 pF while each relay has between 2 and 3 pF (depending on brand). As these impedances are comparable, a relay will likely not fully switch off a cell, making the use of mechanical relays less desirable for this application. Further, mechanical relays may be less reliable as well. In addition, by using m+n power amplifiers, the time spent driving the work is distributed among all the Pas and will not be running during the whole sterilization time. This increases reliability given each PA operates for less time.

In an embodiment, when plasma is generated across a single cell, the adjacent cells do present some voltage across them. This can occur because the electrodes being powered cover a complete row and column as shown in FIG. 24A. However, this voltage or adjacent cells decays along the row (or column) and does not generate plasma across the adjacent cells. Accordingly, the power consumed by the voltage across adjacent cells is not significant. FIG. 24A shows that plasma across cell (0,1) is generated by enabling power amplifier 1 and power amplifier 6, while FIG. 24B shows the voltage across adjacent cells decays to a low value that is not high enough to produce plasma, such that power loss across adjacent cells is not significant. To further reduce the voltage across the adjacent cells, the material used as the substrate can have electrical properties that increase the decaying of the electric field more rapidly.

In a specific embodiment, the size of each cell is approximately 1" by 1". In additional embodiments, the cells can be made much smaller (e.g., 0.1" by 0.1"), if desired. With embodiments having smaller cells for the same overall surface area, the number of power amplifiers can increase, while the power requirement per cell decreases. In this way, the power needed to generate plasma across a certain surface area is divided among more power amplifiers. Since power requirements per power amplifier decreases, components can be reduced in size. Also, using smaller cells increases the "resolution" of the surface plasma. This is the same concept as the pixels on a computer screen. The more pixels, the better the resolution. For a plasma sterilizer, the more resolution, the more efficient the system can be is at generating plasma only across the contaminated cells.

Embodiments

1. A system for powering an array of electrode pair, comprising:

an array of electrode pairs, wherein the array of electrode pairs has m rows and n columns, where m and n are integers and at least one of m and n is greater than 1, wherein each electrode pair of the array of electrode pairs has a first electrode and a second electrode;

a first power amplifier, wherein the first power amplifier selectively powers at least the first electrode of the electrode pairs of at least one of the m rows;

a second power amplifier, wherein the second power amplifier selectively powers at least the second electrode of the electrode pairs of at least one of the n columns;

wherein at least one electrode pair of the array of electrode pairs is simultaneously powered by the first power amplifier and the second power amplifier, such that a voltage across the at least one electrode pair simultaneously powered by the first power amplifier and the second power is a sum of a first voltage of the first power amplifier and a second voltage of the second power amplifier.

2. Embodiment 1, wherein both m and n are greater than 1.

3. Embodiment 2, wherein the first power amplifier selectively powers the first electrode of all of the electrode pairs of the at least one of the m rows.

4. Embodiment 3, wherein the second power amplifier selectively powers the second electrode of all of the electrode pairs of the at least one of the n columns.

5. Embodiment 4, wherein the first power amplifier selectively powers the first electrode of all of the electrode pairs of all the m rows, wherein the second power amplifier selectively powers the second electrode of all of the electrode pairs of all of the n columns.

6. Embodiment 1, further comprising:

an m first amplifiers, wherein each of the m first amplifiers selectively powers the first electrode of all of the electrode pairs of a corresponding row of the m rows, an n second amplifiers, wherein each of the n second amplifiers selectively powers the second electrode of all of the electrode pairs of a corresponding column o of the n columns, wherein each (s,t) electrode pair of the array of electrode pairs is selectively simultaneously powered by the $s^{th}$ first power amplifier and the $t^{th}$ second power amplifier, where s=1, 2, . . . , m and t=n, such that the voltage across the (s,t) electrode pair simultaneously powered by the $s^{th}$ first power amplifier and $t^{th}$ second power amplifier is the sum of the first voltage of the $s^{th}$ first power amplifier and the second voltage of the t second power amplifier.

Embodiment 7. A power supply unit, comprising:
at least one power amplifier having a first inductor, a transformer, and a feedback mechanism,
wherein the power supply unit is adapted to supply power to at least one load,
wherein the feedback mechanism is configured to monitor at least one parameter of the power supply unit or at least one load, wherein the at least one parameter provides information regarding a frequency of operation of the power supply unit, and
wherein the feedback mechanism is configured such that, when the at least one parameter indicates that the frequency of operation is away from a resonant frequency, the feedback mechanism adjusts the frequency of operation closer to the resonant frequency.

Embodiment 8. The power supply unit according to Embodiment 7, wherein the at least one parameter is a voltage drop across one or more of the at least one load.

Embodiment 9. The power supply unit according to Embodiment 7, wherein the at least one parameter is an output voltage of the at least one power amplifier, an output current of the at least one power amplifier, an input voltage of the at least one power amplifier, an input current of the at least one power amplifier, or an electric field of a load connected to the at least one power amplifier.

Embodiment 10. The power supply unit according to Embodiment 7, wherein the at least one parameter is an output voltage of the at least one power amplifier.

Embodiment 11. The power supply unit according to Embodiment 7, wherein the at least one power amplifier further comprises a first capacitor in parallel with a transistor.

Embodiment 12. The power supply unit according to Embodiment 7, comprising at least two power amplifiers, wherein the power supply unit further comprises a controller for controlling a supply voltage to the at least two power amplifiers.

Embodiment 13. The power supply unit according to Embodiment 12, wherein the controller is configured such that the supply voltage is supplied to the at least two power amplifiers in a duty cycle such that each power amplifier is supplied the supply voltage for a corresponding portion of a corresponding at least two portions of each cycle of the duty cycle and not supplied the supply voltage for a corresponding remainder of a corresponding at least two remainders of each cycle of the duty cycle.

Embodiment 14. The power supply unit according to Embodiment 13, wherein the supply voltage is supplied to each of the at least two power amplifiers proportionally in a temporal sense, such that if the number of power amplifiers of the power supply unit is represented by "X", each power amplifier is supplied with the supply voltage for up to 1/X of each cycle of the duty cycle.

Embodiment 15. The power supply unit according to Embodiment 7, wherein the power supply unit is capable of providing an output voltage of at least 1 kVpp.

Embodiment 16. The power supply unit according to Embodiment 7, wherein the power supply unit is capable of providing output power to at least two loads.

Embodiment 17. The power supply unit according to Embodiment 7, wherein the power supply unit has a footprint of less than 25 square inches.

Embodiment 18. The power supply unit according to Embodiment 7, wherein the power supply unit has a weight of less than 100 g.

Embodiment 19. The power supply unit according to Embodiment 11, wherein the at least one power amplifier further comprises a power supply filter comprising a second inductor and a second capacitor.

Embodiment 20. The power supply unit according to Embodiment 7, wherein the feedback mechanism is configured such that, if the at least one parameter indicates that the frequency of operation is more than 5% away from a resonant frequency of the power amplifier, the feedback mechanism adjusts the frequency of operation closer to the resonant frequency of the power amplifier.

Embodiment 21. The power supply unit according to Embodiment 7, wherein the feedback mechanism is configured such that, if the at least one parameter indicates that the frequency of operation is more than 3% away from a resonant frequency of the power amplifier, the feedback mechanism adjusts the frequency of operation closer to the resonant frequency of the power amplifier.

Embodiment 22. The power supply unit according to Embodiment 7, wherein the feedback mechanism is configured such that, if the at least one parameter indicates that the frequency of operation is more than 2% away from a resonant frequency of the power amplifier, the feedback mechanism adjusts the frequency of operation closer to the resonant frequency of the power amplifier.

Embodiment 23. A system, comprising:
a power supply unit; and
at least one load,
wherein the power supply unit comprises:
at least one power amplifier having a first inductor and a transformer, and a feedback mechanism,
wherein the feedback mechanism is configured to monitor at least one parameter of the system, wherein the at least one parameter provides information regarding a frequency of operation of the system, and
wherein the feedback mechanism is configured such that, when the at least one parameter indicates that the frequency of operation is away from a resonant frequency, the feedback mechanism adjusts the frequency of operation closer to the resonant frequency.

Embodiment 24. The system according to Embodiment 23, wherein the at least one parameter is a voltage drop across one or more of the at least one load.

Embodiment 25. The system according to Embodiment 23, wherein the at least one parameter is an output voltage of the at least one power amplifier, an output current of the at least one power amplifier, an input voltage of the at least one power amplifier, an input current of the at least one power amplifier, or an electric field of a load connected to the at least one power amplifier.

Embodiment 26. The system according to Embodiment 23, wherein the at least one parameter is an output voltage of the at least one power amplifier.

Embodiment 27. The system according to Embodiment 23, wherein the at least one power amplifier further comprises a first capacitor in parallel with a transistor.

Embodiment 28. The system according to Embodiment 23, wherein each load of the at least one load is connected to a power amplifier of the power supply unit which is configured to supply power to that load.

Embodiment 29. The system according to Embodiment 23, wherein, in operation, the impedance of the at least one load varies.

Embodiment 30. The system according to Embodiment 23, wherein the at least one load is an electrode of a self-sterilizing device having at least two electrodes.

Embodiment 31. The system according to Embodiment 23, wherein the feedback mechanism is configured such that, if the at least one parameter indicates that the frequency of operation is more than 5% away from a resonant frequency of the power amplifier, the feedback mechanism adjusts the frequency of operation closer to the resonant frequency of the power amplifier.

Embodiment 32. The system according to Embodiment 23, wherein the feedback mechanism is configured such that, if the at least one parameter indicates that the frequency of operation is more than 3% away from a resonant frequency of the power amplifier, the feedback mechanism adjusts the frequency of operation closer to the resonant frequency of the power amplifier.

Embodiment 33. The system according to Embodiment 23, wherein the feedback mechanism is configured such that, if the at least one parameter indicates that the frequency of operation is more than 2% away from a resonant frequency of the power amplifier, the feedback mechanism adjusts the frequency of operation closer to the resonant frequency of the power amplifier.

Aspects of the invention may be described in the general context of computer-executable instructions, such as program modules, being executed by a computer. Generally, program modules include routines, programs, objects, components, data structures, etc., that perform particular tasks or implement particular abstract data types. Moreover, those skilled in the art will appreciate that the invention may be practiced with a variety of computer-system configurations, including multiprocessor systems, microprocessor-based or programmable-consumer electronics, minicomputers, mainframe computers, and the like. Any number of computer-systems and computer networks are acceptable for use with the present invention.

Specific hardware devices, programming languages, components, processes, protocols, and numerous details including operating environments and the like are set forth to provide a thorough understanding of the present invention. In other instances, structures, devices, and processes are shown in block-diagram form, rather than in detail, to avoid obscuring the present invention. But an ordinary-skilled artisan would understand that the present invention may be practiced without these specific details. Computer systems, servers, work stations, and other machines may be connected to one another across a communication medium including, for example, a network or networks.

As one skilled in the art will appreciate, embodiments of the present invention may be embodied as, among other things: a method, system, or computer-program product. Accordingly, the embodiments may take the form of a hardware embodiment, a software embodiment, or an embodiment combining software and hardware. In an embodiment, the present invention takes the form of a computer-program product that includes computer-useable instructions embodied on one or more computer-readable media.

Computer-readable media include both volatile and non-volatile media, removable and nonremovable media, and contemplate media readable by a database, a switch, and various other network devices. By way of example, and not limitation, computer-readable media comprise media implemented in any method or technology for storing information. Examples of stored information include computer-useable instructions, data structures, program modules, and other data representations. Media examples include, but are not limited to, information-delivery media, RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These technologies can store data momentarily, temporarily, or permanently.

The invention may be practiced in distributed-computing environments where tasks are performed by remote-processing devices that are linked through a communications network. In a distributed-computing environment, program modules may be located in both local and remote computer-storage media including memory storage devices. The computer-useable instructions form an interface to allow a computer to react according to a source of input. The instructions cooperate with other code segments to initiate a variety of tasks in response to data received in conjunction with the source of the received data.

The present invention may be practiced in a network environment such as a communications network. Such networks are widely used to connect various types of network elements, such as routers, servers, gateways, and so forth. Further, the invention may be practiced in a multi-network environment having various, connected public and/or private networks.

Communication between network elements may be wireless or wireline (wired). As will be appreciated by those skilled in the art, communication networks may take several different forms and may use several different communication protocols. And the present invention is not limited by the forms and communication protocols described herein.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. A power supply unit, comprising:
at least one power amplifier, wherein each power amplifier of the at least one power amplifier comprises a first inductor and a transformer; and
a feedback mechanism;
wherein the power supply unit is configured to receive a supply voltage when the power supply unit is interconnected with a power supply,
wherein the power supply unit is configured to supply power to at least one load when the power supply unit is interconnected with the power supply and the power supply unit is interconnected with the at least one load,
wherein the feedback mechanism is configured to monitor at least one parameter, wherein the at least one parameter comprises one or more parameters selected from the group consisting of: a parameter of the power supply unit and a parameter of the at least one load, wherein the at least one parameter provides information regarding a frequency of operation of the power supply unit, and wherein the feedback mechanism is configured such that, when the at least one parameter indicates that the frequency of operation is away from a resonant frequency, the feedback mechanism adjusts the frequency of operation such that the frequency of operation is closer to the resonant frequency.

2. The power supply unit according to claim 1, wherein the at least one parameter is one or more voltage drops across a corresponding one or more of the at least one load.

3. The power supply unit according to claim 1, wherein the at least one parameter is:
one or more output voltages of a corresponding one or more of the at least one power amplifier,
one or more output currents of a corresponding one or more of the at least one power amplifier,
one or more input voltage of a corresponding one or more of the at least one power amplifier,
one or more input currents of a corresponding one or more of the at least one power amplifier, or
one or more electric fields of a corresponding one or more of the at least one load connected to the at least one power amplifier.

4. The power supply unit according to claim 1, wherein the at least one parameter is one or more output voltages of a corresponding one or more of the at least one power amplifier.

5. The power supply unit according to claim 1, wherein each power amplifier of the at least one power amplifier further comprises a first capacitor in parallel with a transistor.

6. The power supply unit according to claim 5, wherein each power amplifier of the at least one power amplifier further comprises a power supply filter comprising a second inductor and a second capacitor.

7. The power supply unit according to claim 1, wherein the at least one power amplifier is at least two power amplifiers, wherein the power supply unit further comprises a controller, wherein the controller controls a corresponding at least two input voltages to the at least two power amplifiers.

8. The power supply unit according to claim 7, wherein the controller is configured such that the at least two input voltages are supplied to the at least two power amplifiers by supplying a common input voltage in a duty cycle such that each power amplifier of the at least two power amplifiers is supplied the common input voltage for a corresponding portion of a corresponding at least two portions of each cycle of the duty cycle and not supplied the common input voltage for a corresponding remainder of a corresponding at least two remainders of each cycle of the duty cycle.

9. The power supply unit according to claim 8, wherein the at least two power amplifier is X power amplifiers, wherein each power amplifier of the X power amplifiers is supplied with the common input voltage for 1/Y of each cycle of the duty cycle, where 1/Y≤1/X.

10. The power supply unit according to claim 1, wherein the power supply unit is configured to provide an output voltage of at least 1 kVpp.

11. The power supply unit according to claim 1, wherein the power supply unit is configured to supply power to at least two loads.

12. The power supply unit according to claim 1, wherein the power supply unit has a footprint of less than 25 square inches.

13. The power supply unit according to claim 1, wherein the power supply unit has a weight of less than 100 g.

14. The power supply unit according to claim 1, wherein the feedback mechanism is configured such that, when the at least one parameter indicates that the frequency of operation is more than 5% away from a resonant frequency of the power amplifier, the feedback mechanism adjusts the frequency of operation such that the frequency of operation is closer to the resonant frequency of the power amplifier.

15. The power supply unit according to claim 1, wherein the feedback mechanism is configured such that, when the at least one parameter indicates that the frequency of operation is more than 3% away from a resonant frequency of the power amplifier, the feedback mechanism adjusts the frequency of operation such that the frequency of operation is closer to the resonant frequency of the power amplifier.

16. The power supply unit according to claim 1, wherein the feedback mechanism is configured such that, when the at least one parameter indicates that the frequency of operation is more than 2% away from a resonant frequency of the power amplifier, the feedback mechanism adjusts the frequency of operation such that the frequency of operation is closer to the resonant frequency of the power amplifier.

17. A system, comprising:
a power supply unit; and
at least one load, wherein the system is configured to receive a supply voltage when the system is interconnected with a power supply, wherein the power supply unit is configured to supply power to the at least one load when the system is interconnected with the power supply,
wherein the power supply unit comprises:
at least one power amplifier, wherein each power amplifier of the at least one power amplifier comprises a first inductor and a transformer; and
a feedback mechanism,
wherein the feedback mechanism is configured to monitor at least one parameter of the system, wherein the at least one parameter provides information regarding a frequency of operation of the system, and
wherein the feedback mechanism is configured such that, when the at least one parameter indicates that the frequency of operation is away from a resonant frequency, the feedback mechanism adjusts the frequency of operation such that the frequency of operation is closer to the resonant frequency.

18. A method of providing power to at least one load, comprising:
interconnecting a power supply unit and at least one load, wherein the power supply unit comprises:
at least one power amplifier, wherein each power amplifier of the at least one power amplifier comprises a first inductor and a transformer; and
a feedback mechanism,
wherein the power supply unit is configured to receive a supply voltage when the power supply unit is interconnected with a power supply,
wherein the power supply unit is configured to supply power to the at least one load when the power supply unit is interconnected with the power supply and the power supply unit is interconnected with the at least one load,
wherein the feedback mechanism is configured to monitor at least one parameter, wherein the at least one parameter comprises one or more parameters selected from the group consisting of: a parameter of the power supply unit and a parameter of the at least one load, wherein the at least one parameter provides information regarding a frequency of operation of the power supply unit, and wherein the feedback mechanism is configured such that, when the at least one parameter indicates that the frequency of operation is away from a resonant frequency, the feedback mechanism adjusts the frequency of operation such that the frequency of operation is closer to the resonant frequency;

supplying power to the at least one load via the power supply unit, wherein supplying power to the at least one load via the power supply unit comprises:

interconnecting the power supply unit to the power supply;

interconnecting the power supply unit with the at least one load;

monitoring the at least one parameter via the feedback mechanism; and adjusting the frequency of operation such that the frequency of operation is closer to the resonant frequency via the feedback mechanism when the at least one parameter indicates that the frequency of operation is away from the resonant frequency.

19. The system according to claim 17, wherein the at least one parameter is a voltage drop across one or more of the at least one load.

20. The system according to claim 17, wherein the at least one parameter is an output voltage of the at least one power amplifier, an output current of the at least one power amplifier, an input voltage of the at least one power amplifier, an input current of the at least one power amplifier, or an electric field of a load connected to the at least one power amplifier.

21. The system according to claim 17, wherein the at least one parameter is an output voltage of the at least one power amplifier.

22. The system according to claim 17, wherein the at least one power amplifier further comprises a first capacitor in parallel with a transistor.

23. The system according to claim 17, wherein each load of the at least one load is connected to a power amplifier of the power supply unit which is configured to supply power to that load.

24. The system according to claim 17, wherein, in operation, the impedance of the at least one load varies.

25. The system according to claim 17, wherein the at least one load is an electrode of a self-sterilizing device having at least two electrodes.

26. The system according to claim 17, wherein the feedback mechanism is configured such that, if the at least one parameter indicates that the frequency of operation is more than 5% away from a resonant frequency of the power amplifier, the feedback mechanism adjusts the frequency of operation closer to the resonant frequency of the power amplifier.

27. The system according to claim 17, wherein the feedback mechanism is configured such that, if the at least one parameter indicates that the frequency of operation is more than 3% away from a resonant frequency of the power amplifier, the feedback mechanism adjusts the frequency of operation closer to the resonant frequency of the power amplifier.

28. The system according to claim 17, wherein the feedback mechanism is configured such that, if the at least one parameter indicates that the frequency of operation is more than 2% away from a resonant frequency of the power amplifier, the feedback mechanism adjusts the frequency of operation closer to the resonant frequency of the power amplifier.

* * * * *